US009042152B2

(12) United States Patent
Kim et al.

(10) Patent No.: US 9,042,152 B2
(45) Date of Patent: May 26, 2015

(54) DATA READ CIRCUIT, A NON-VOLATILE MEMORY DEVICE HAVING THE SAME, AND A METHOD OF READING DATA FROM THE NON-VOLATILE MEMORY DEVICE

(75) Inventors: Chan-kyung Kim, Hwaseong-si (KR); Hong-sun Hwang, Suwon-si (KR); Chul-woo Park, Yongin-si (KR); Sang-beom Kang, Hwaseong-si (KR); Hyung-rok Oh, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 280 days.

(21) Appl. No.: 13/562,871

(22) Filed: Jul. 31, 2012

(65) Prior Publication Data
US 2013/0051114 A1    Feb. 28, 2013

(30) Foreign Application Priority Data

Aug. 25, 2011  (KR) .................. 10-2011-0085146
Oct. 27, 2011  (KR) .................. 10-2011-0110719

(51) Int. Cl.
| G11C 11/00 | (2006.01) |
| G11C 13/00 | (2006.01) |
| G11C 11/16 | (2006.01) |
| G11C 7/06  | (2006.01) |
| G11C 7/08  | (2006.01) |
| G11C 7/14  | (2006.01) |
| G11C 11/56 | (2006.01) |

(52) U.S. Cl.
CPC ........ *G11C 13/0033* (2013.01); *G11C 11/1673* (2013.01); *G11C 13/0004* (2013.01); *G11C 13/0023* (2013.01); *G11C 13/004* (2013.01); *G11C 13/0061* (2013.01); *G11C 2013/0042* (2013.01); *G11C 2013/0054* (2013.01); *G11C 7/062* (2013.01); *G11C 7/067* (2013.01); *G11C 7/08* (2013.01); *G11C 7/14* (2013.01); *G11C 11/5678* (2013.01)

(58) Field of Classification Search
CPC ......... G11C 13/004; G11C 7/062; G11C 7/06
USPC .................. 365/145, 203, 129, 148, 158, 163
See application file for complete search history.

(56) References Cited

U.S. PATENT DOCUMENTS

| 6,147,918 A  * | 11/2000 | Takashima et al. ........... 365/207 |
| 6,924,998 B2 * | 8/2005  | Kang ............................. 365/145 |
| 8,446,753 B2 * | 5/2013  | Kim et al. ..................... 365/148 |
| 8,693,272 B2 * | 4/2014  | Jung et al. ..................... 365/206 |

* cited by examiner

*Primary Examiner* — Harry W Byrne
(74) *Attorney, Agent, or Firm* — F. Chau & Associates, LLC

(57) ABSTRACT

A non-volatile memory device including a cell array, which includes a plurality of memory cells, and a sense amplification circuit. The sense amplification circuit is configured to receive a data voltage of a memory cell, a first reference voltage and a second reference voltage during a data read operation of the memory cell, generate differential output signals based on a voltage level difference between the data voltage and the first and second reference voltages, and output the differential output signals as data read from the memory cell.

20 Claims, 27 Drawing Sheets

FIG. 8
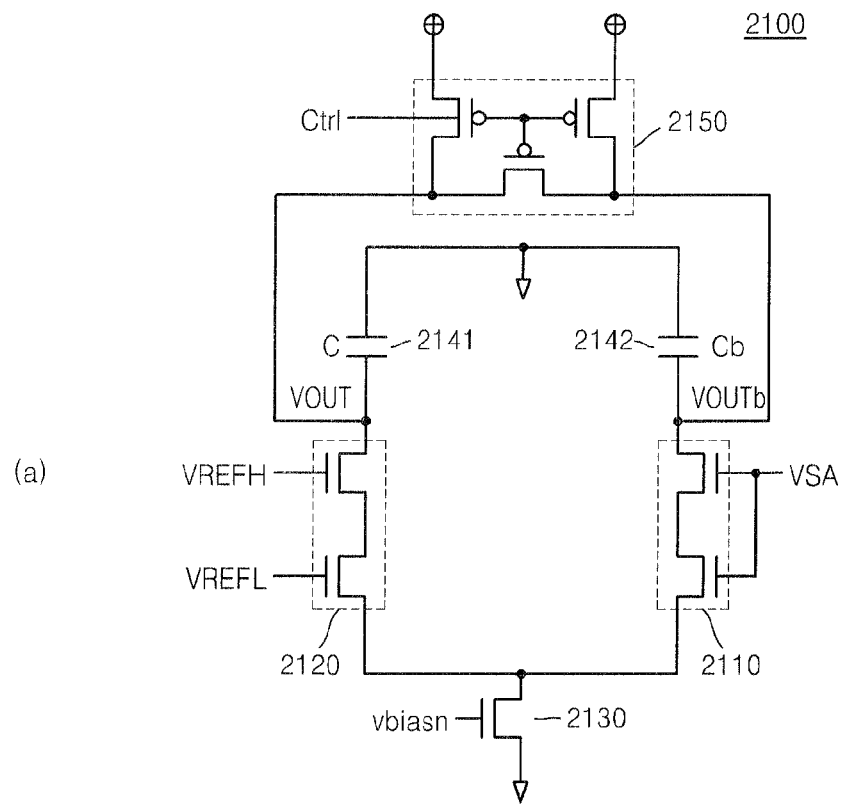
(a)
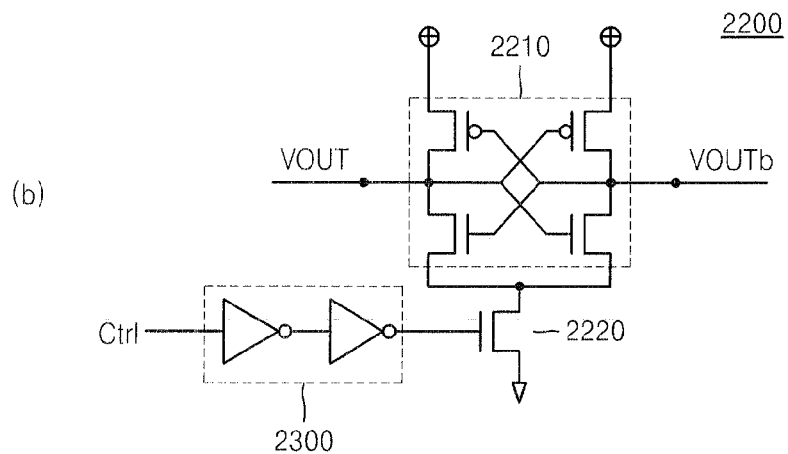
(b)

FIG. 18B
| MSB/LSB | VOUT | VOUTM | VOUTLM | VOUTHM |
|---|---|---|---|---|
| 00 | L | L | L | L |
| 01 | L | L | H | L |
| 10 | H | H | H | L |
| 11 | H | H | H | H |
FIG. 19A
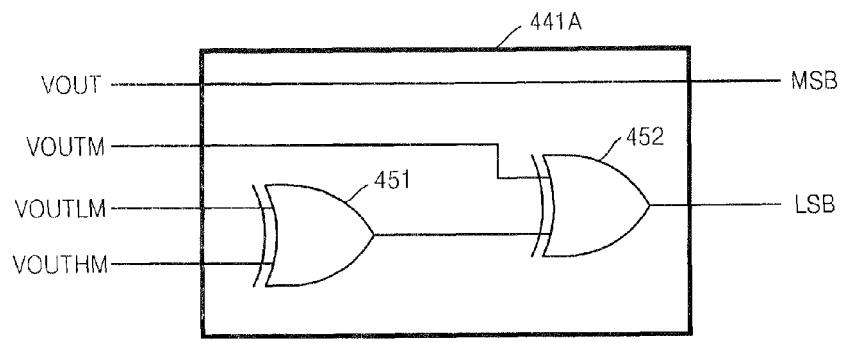
FIG. 19B
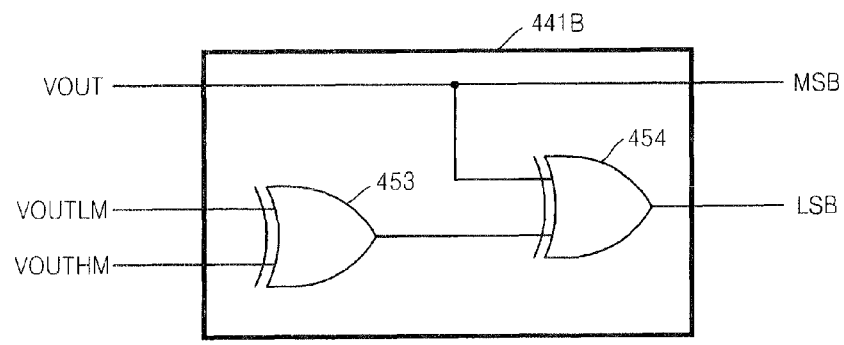

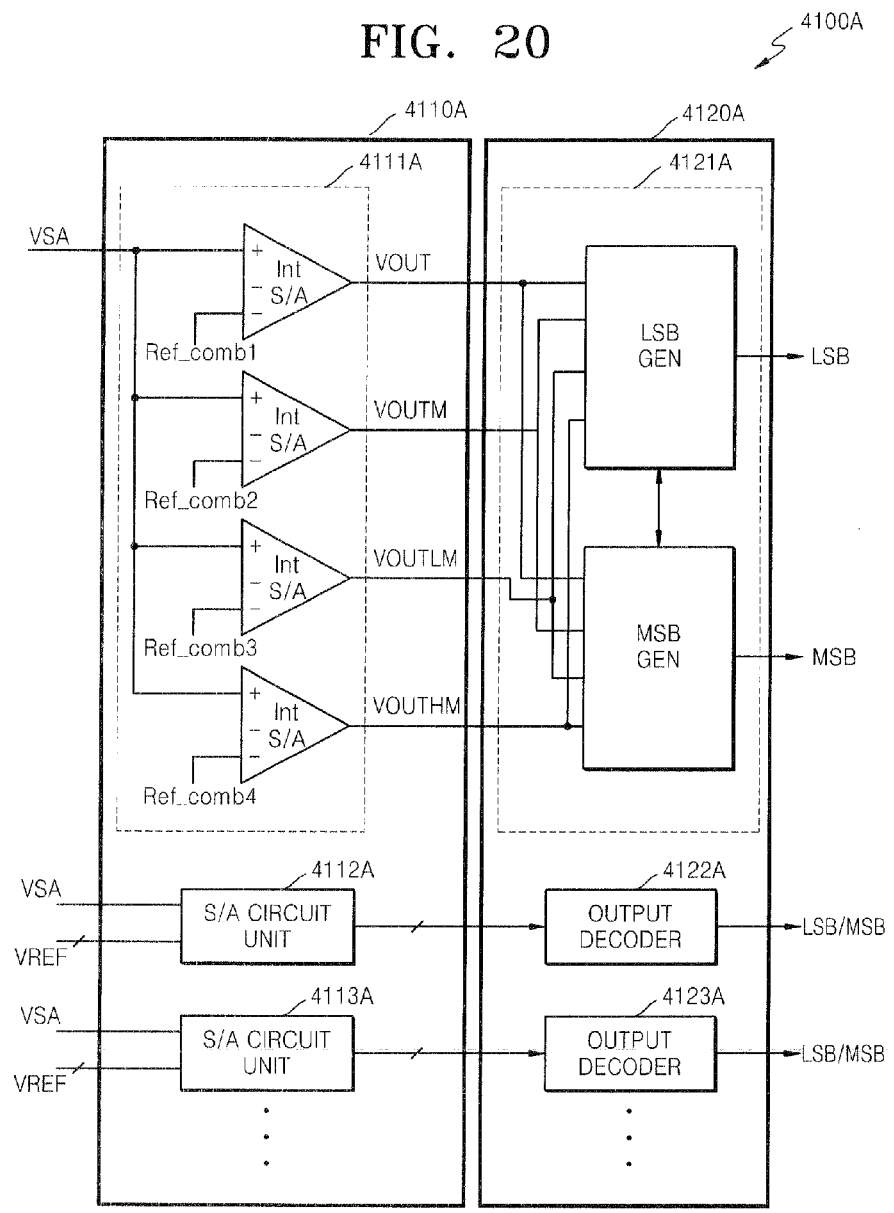

US 9,042,152 B2

DATA READ CIRCUIT, A NON-VOLATILE MEMORY DEVICE HAVING THE SAME, AND A METHOD OF READING DATA FROM THE NON-VOLATILE MEMORY DEVICE

CROSS-REFERENCE TO RELATED APPLICATIONS

This application claims priority under 35 U.S.C. §119 to Korean Patent Application No. 10-2011-0085146, filed on Aug. 25, 2011, in the Korean Intellectual Property Office and Korean Patent Application No. 10-2011-0110719, filed on Oct. 27, 2011, in the Korean Intellectual Property Office, the disclosures of which are incorporated by reference herein in their entireties.

BACKGROUND

1. Technical Field

The inventive concept relates to a data read circuit, and more particularly, to a data read circuit for performing a data read operation by using a plurality of reference voltages, a non-volatile memory device including the data read circuit, and a method of reading data from the non-volatile memory device.

2. Discussion of the Related Art

Semiconductor memory is an electronic data storage device, implemented on a semiconductor-based integrated circuit. Examples of semiconductor memory devices may include volatile memory devices and non-volatile memory devices. Volatile memory devices require power to maintain the stored information, non-volatile memory devices do not.

Examples of non-volatile memory devices may include a Phase Change Random Access Memory (PRAM), a Resistive Random Access Memory (RRAM), a Magnetic Random Access Memory (MRAM), and a Ferroelectric Random Access Memory (FRAM). PRAM stores data by altering the state of the matter from which the device is fabricated, RRAM uses a variable-resistance material, for example, complex metal oxides whose resistance value change when voltage is applied, to store data, MRAM data is stored by magnetic storage elements formed from two ferromagnetic plates, and FRAM uses a ferroelectric layer to store data.

Semiconductor memory devices with improved performance are being developed at an almost frantic pace. Improved performance may by achieved by increasing a degree of integration, increasing operating speed, or guaranteeing data reliability. However, due to a number of factors such as process variations that occur when the semiconductor memory device is fabricated or a variation in signals provided to circuits for operating the semiconductor memory device (for example, circuits for writing or reading data), performance degradation may still occur. Therefore, there is a need for a semiconductor memory device capable of reducing performance degradation.

SUMMARY

The inventive concept provides a data read circuit capable of improving the performance of a semiconductor memory device by guaranteeing data reliability in view of multiple factors that typically have a negative impact on performance, for example. The inventive concept provides a non-volatile memory device including the data read circuit, and a method of reading data from the non-volatile memory device.

According to an exemplary embodiment of the inventive concept, a method of reading data from a non-volatile memory device includes: receiving, at a first sense amplifier, a data voltage, a first reference voltage and a second reference voltage, wherein the data voltage corresponds to data stored in a memory cell; sensing, at the first sense amplifier, a voltage level difference between the data voltage and the first and second reference voltages to generate first and second differential output signals; and amplifying, at a second sense amplifier, the first and second differential output signals to generate read data for the memory cell.

The second sense amplifier amplifies the first and second differential output signals after a first delay.

The first delay is a time from when the first sense amplifier is enabled to when the second sense amplifier is enabled.

The method further includes pre-charging first and second differential output terminals of the first sense amplifier to first level voltages in response to a control signal, prior to receiving the data voltage and the first and second reference voltages.

The sensing performed at the first sense amplifier includes: storing two voltage levels applied to the first and second differential output terminals, wherein the two voltage levels are based on the voltage level difference between the data voltage and the first and second reference voltages.

The sensing performed at the first sense amplifier includes: providing, from the first sense amplifier, the two voltage levels as the first and second differential output signals to the second sense amplifier in response to a version of the control signal delayed by the first delay, wherein the amplification performed at the second sense amplifier comprises: amplifying the first and second differential output signals; and outputting the amplified first and second differential output signals as the read data.

According to an exemplary embodiment of the inventive concept, a non-volatile memory device includes: a cell array including a plurality of memory cells; and a sense amplification circuit configured to receive a data voltage of a memory cell, a first reference voltage and a second reference voltage during a data read operation of the memory cell, generate differential output signals based on a voltage level difference between the data voltage and the first and second reference voltages, and output the differential output signals as data read from the memory cell.

The sense amplification circuit includes: a first sense amplifier, in response to a control signal, the first sense amplifier is configured to receive the data voltage and the first and second reference voltages and generate the differential output signals based on the voltage level difference between the data voltage and the first and second reference voltages; a delay unit configured to receive the control signal and generate a delayed control signal; and a second sense amplifier, in response to the delayed control signal, the second sense amplifier is configured to amplify the differential output signals and output the amplified differential output signals as the data read from the memory cell.

The non-volatile memory device further includes: a first reference voltage generation unit configured to generate the first reference voltage; and a second reference voltage generation unit configured to generate the second reference voltage, wherein the first and second reference voltage generation units are separate from the cell array.

The non-volatile memory device further includes a reference cell array, the reference cell array including: a first reference cell configured to generate the first reference voltage; and a second reference cell configured to generate the second reference voltage.

The first and second reference cells have the same structure as the memory cell.

The data voltage has a high voltage level or a low voltage level.

The first reference voltage has the same voltage level as the data voltage and the second reference voltage has a different voltage level than the data voltage.

The second reference voltage has the same voltage level as the data voltage and the first reference voltage has a different voltage level than the data voltage.

The memory cell is a magnetic random access memory (MRAM), phase change random access memory (PRAM), resistive random access memory (RRAM), or ferroelectric random access memory (FRAM).

According to an exemplary embodiment of the inventive concept, a non-volatile memory device includes: a cell array including a memory cell, a first reference cell and a second reference cell, wherein the memory cell is connected to a first bit line, the first reference cell is connected to a second bit line and the second reference cell is connected to a third bit line; and a sense amplifier configured to receive a data voltage of the memory cell provided from the first bit line, a first reference voltage of the first reference cell provided from the second bit line and a second reference voltage of the second reference cell provided from the third bit line and, in response to the receipt of the data voltage and the first and second reference voltages, the sense amplifier is configured to determine a difference between the data voltage and the first and second reference voltages and output this difference as data read from the memory cell.

The difference between the data voltage and the first and second reference voltages is determined after a time delay measured from when a first part of the sense amplifier is enabled by a control signal to when a delayed version of the control signal enables a second part of the sense amplifier.

The data voltage is generated by a data voltage generating unit including the memory cell, the first reference voltage is generated by a first reference voltage generating unit including the first reference cell and the second reference voltage is generated by a second reference voltage generating unit including the second reference cell, wherein the data voltage generating unit, the first reference voltage generating unit and the second reference voltage generating unit each have the same structure.

According to an exemplary embodiment of the inventive concept, a non-volatile memory device includes: a first sense amplifier, a second sense amplifier and a delay unit, the first sense amplifier including a first input unit for receiving a data voltage, a second input unit for receiving first and second reference voltages, a first biasing unit for biasing the first sense amplifier, a pre-charge unit for pre-charging a first differential output terminal connected to the first input unit and a second differential output terminal connected to the second input unit, a first capacitor for storing a first voltage at the first differential output terminal, and a second capacitor for storing a second voltage at the second differential output terminal, wherein the first and second voltages are based on a voltage level difference between the data voltage and the first and second reference voltages; the delay unit for receiving a control signal that activates the pre-charge unit, delaying the control signal and providing the delayed control signal to the second sense amplifier; and the second sense amplifier including a second biasing unit for receiving the delayed control signal to enable the second sense amplifier and a latch having a first node connected to the first differential output terminal and a second node connected to the second differential output terminal and, when the second sense amplifier is enabled, the latch amplifies the stored first and second voltages and outputs the amplified first and second voltages via the first and second differential output terminals, respectively.

The first input unit includes first and second serially connected transistors.

The first and second transistors include metal oxide semiconductor transistors.

The second input unit includes third and fourth serially connected transistors.

The third and fourth transistors include metal oxide semiconductor transistors.

According to an exemplary embodiment of the inventive concept, a spin torque transfer (STT) MRAM device includes: a sense amplifier having a first node that receives a data voltage provided from a memory cell, a second node that receives a first reference voltage, a third node that receives a second reference voltage, and a fourth node that outputs a signal as data read from the memory cell, wherein the signal is based on a voltage level difference between the data voltage and the first and second reference voltages.

The first reference voltage is provided from a first reference voltage generation unit and the second reference voltage is provided from a second reference voltage generation unit.

The first and second reference voltage generation units are included in a memory cell array, or are separate from the memory cell array.

The voltage level difference between the data voltage and the first and second reference voltages is stored in at least two capacitors of the sense amplifier.

The first node is connected to a gate of a first transistor, the second node is connected to a gate of a second transistor and the third node is connected to a gate of a third transistor.

BRIEF DESCRIPTION OF THE DRAWINGS

The above and other features of the inventive concept will become more apparent by describing in detail exemplary embodiments thereof with reference to the accompanying drawings in which:

FIGS. 7 and 8 are circuit diagrams illustrating the sense amplification circuit shown in FIG. 6 according to an exemplary embodiment of the inventive concept;

FIG. 18B is a table for explaining the outputting of multi-bit least significant bit (LSB) data and most significant bit (MSB) data, according to an exemplary embodiment of the inventive concept;

FIGS. 19A and 19B are circuit diagrams illustrating a decoding circuit of FIG. 18A, according to exemplary embodiments of the inventive concept;

FIG. 20 is a block diagram illustrating a non-volatile memory device that may include the data read circuit of FIG. 15, according to an exemplary embodiment of the inventive concept;

DETAILED DESCRIPTION OF THE EMBODIMENTS

Figure 1:
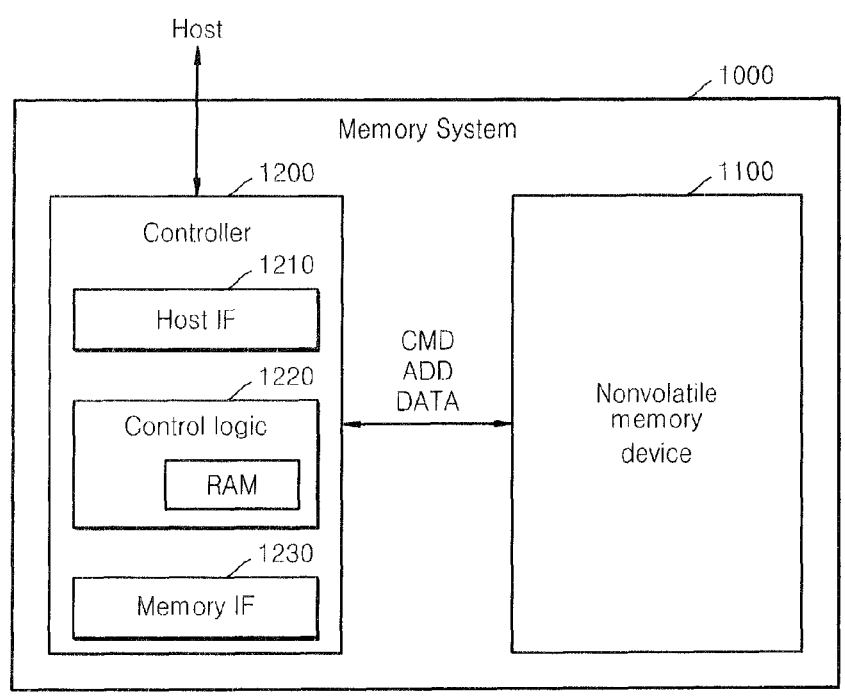
FIG. 1 is a block diagram of a memory system according to an exemplary embodiment of the inventive concept.

Hereinafter, exemplary embodiments of the inventive concept will be described in detail with reference to the accompanying drawings. Throughout the drawings and specification, like reference numerals may refer to like elements.

Examples of non-volatile memory devices may include a Phase Change Random Access Memory (PRAM), a Resistive Random Access Memory (RRAM), a Magnetic Random Access Memory (MRAM), and a Ferroelectric Random Access Memory (FRAM). The non-volatile memory devices such as the PRAM, the RRAM, and the MRAM may have low-cost and high-capacity features of a Dynamic Random Access Memory (DRAM), an operating speed of a Static Random Access Memory (SRAM), and non-volatility of a flash memory. For example, a read access time of a Spin Torque Transfer (STT)-MRAM, which is a type of MRAM, has been reduced to 10 ns or less.

In general, a non-volatile memory device includes a read circuit for reading data of a memory cell, and the read circuit includes a sense amplifier for comparing a developed voltage of the memory cell with a reference voltage. In a non-volatile memory device such as an MRAM, a PRAM, and an RRAM, variations may occur in a resistance value of a cell which stores data, a bias current value of a current source, and a bit line resistance component. In addition, since the reference voltage applied from outside is transferred over the entire memory region, a variation in the reference voltage may also result. Performance degradation may occur due to such variations.

FIG. 1 is a block diagram of a memory system according to an exemplary embodiment of the inventive concept. As shown in FIG. 1, a memory system 1000 may include a non-volatile memory device 1100 and a controller 1200. The non-volatile memory device 1100 may include a memory cell array including a plurality of non-volatile memory cells and a peripheral circuit for performing read/write operations with respect to the memory cell array. The controller 1200 generates a command/address (CMD/ADD) for controlling the non-volatile memory device 1100 and provides write data DATA to the non-volatile memory device 1100 or receives read data DAFA from the non-volatile memory device 1100.

The controller 1200 may include a host interface (IF) 1210 for interfacing with a host and a memory IF 1230 for interfacing with the non-volatile memory device 1100. A control logic unit 1220 for controlling the overall operation of the controller 1200 may be further included in the controller 1200. For example, the control logic unit 1220 provides various control signals for read/write operations with respect to the non-volatile memory device 1100 to the non-volatile memory device 1100 through the memory IF 1230 according to a command input from the host. A RAM may be disposed inside or outside the control logic unit 1220, such that write data may be temporarily stored in the RAM in a data write operation or read data may be temporarily stored in the RAM in a data read operation.

Names of components disclosed herein represent examples which can be applied to the inventive concept, and the non-volatile memory device 1100 and the controller 1200 may be implemented with separate semiconductor chips or separate semiconductor packages. The non-volatile memory device 1100 and the controller 1200 may be integrated in a single chip or in a single semiconductor package, and in this case, the non-volatile memory device 1100 may itself be referred to as a memory system including a memory device and a controller. The memory system 1000 including the non-volatile memory device 1100 and the controller 1200 may be implemented with a memory card such as a Secure Digital (SD) card, a Multi-Media Card (MMC), or the like.

Figure 2A:
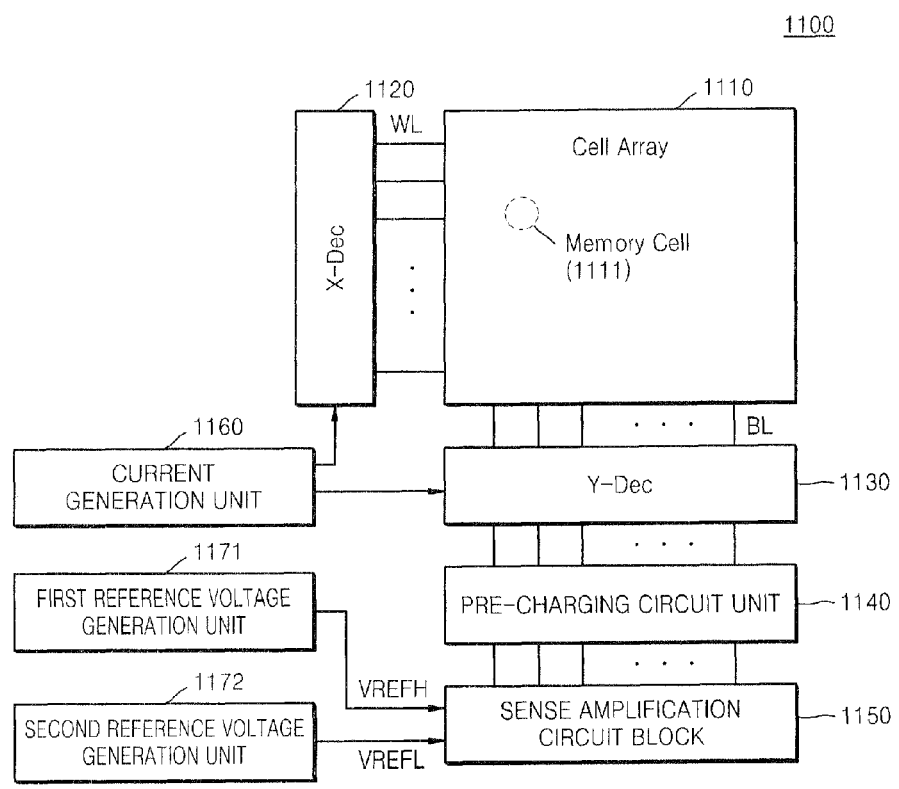
FIG. 2A is a block diagram illustrating a non-volatile memory device shown in FIG. 1 according to an exemplary embodiment of the inventive concept.
Figure 2B:
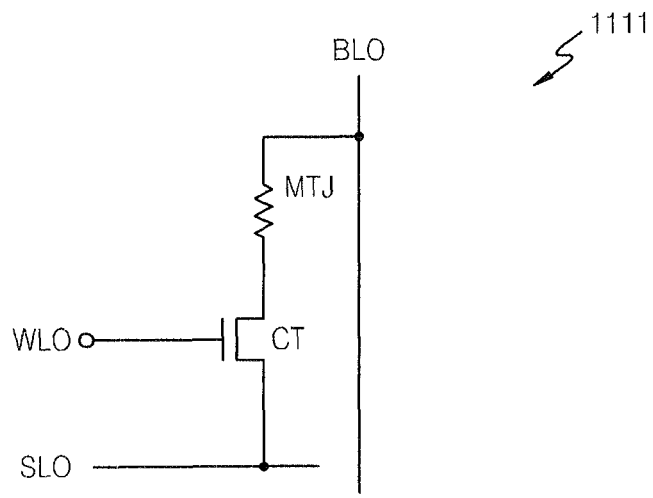
FIG. 2B is a circuit diagram of a memory cell in the non-volatile memory device shown in FIG. 2A.
Figure 2C:
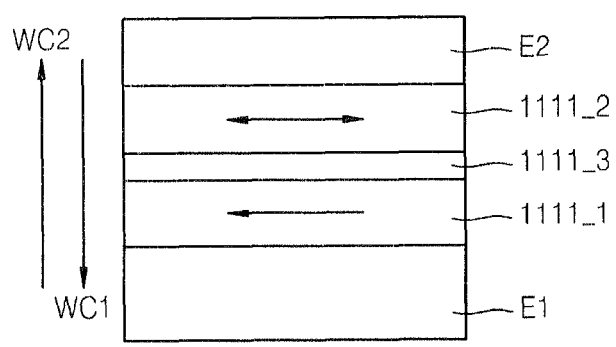
FIG. 2C is a cross-sectional view of a Magnetic Tunnel Junction (MTJ) of the memory cell shown in FIG. 2B.

FIGS. 2A, 2B, and 2C are diagrams illustrating an example of the non-volatile memory device 1100 shown in FIG. 1. FIG. 2A is a block diagram of an MRAM device as an example of the non-volatile memory device 1100, FIG. 2B is a circuit diagram of a unit cell shown in FIG. 2A, and FIG. 2C is a cross-sectional view of a structure of a Magnetic Tunnel Junction (MTJ) of the unit cell shown in FIG. 2B.

Referring to FIGS. 2A, 2B, and 2C, an operation of the non-volatile memory device 1100 will be described. As shown in FIG. 2A, the non-volatile memory device 1100 may include a cell array 1110 including a plurality of memory cells, a row decoder 1120 for selecting a word line WL of the cell array 1110, a column decoder 1130 for selecting a bit line BL of the cell array 1110, a pre-charge circuit unit 1140 for performing a pre-charging operation with respect to a bit line BL, and a sense amplification circuit block 1150 for sensing/amplifying data of a bit line BL of a memory cell 1111 in the cell array 1110. The non-volatile memory device 1100 may include a current generation unit 1160 for generating a current provided to a word line WL and/or a bit line BL, and reference voltage generation units 1171 and 1172 for generating various reference voltages VREFH and VREFL for data sensing. In FIG. 2A, a first reference voltage generation unit 1171 for generating a high-level reference voltage VREFH and a second reference voltage generation unit 1172 for generating a low-level reference voltage VREFL are shown as examples.

The cell array 1110 includes a plurality of memory cells (e.g., MRAM cells) 1111 which are formed in intersecting regions between word lines WL and bit lines BL. Each of the memory cells 1111 may include a single Cell Transistor (CT) and a single MTJ.

Each of the row decoder 1120 and the column decoder 1130 may include a plurality of Metal Oxide Semiconductor (MOS)-based switches. The row decoder 1120 selects word lines WL in response to row addresses, and the column decoder 1130 selects bit lines BL in response to column addresses. The pre-charge circuit unit 1140 pre-charges the bit lines 13L to a predetermined pre-charge level, and thereafter, in a data read operation, voltages of the bit lines BL are developed according to a data value stored in the memory cell 1111. The sense amplification circuit block 1150 includes a plurality of sense amplification circuits for the bit lines BL, and senses and amplifies the developed voltages of the bit lines BL.

The current generated in the current generation unit 1160 is provided to the bit lines BL as a constant value. The voltage level of the bit lines BL may have a level based on a current value generated in the current generation unit 1160 and a data value stored in the memory cell 1111. For example, the MTJ of the memory cell 1111 has a large resistance value or a small resistance value according to a written data value, and a voltage of a different level according to change in the resistance value is provided to the sense amplification circuit block 1150 as a data voltage.

According to an exemplary embodiment of the inventive concept, at least two reference voltages VREFL and VREFH are provided to the sense amplification circuit block 1150. Although the first reference voltage VREFH and the second reference voltage VREFL are generated in the first reference voltage generation unit 1171 and the second reference voltage generation unit 1172 of the non-volatile memory device 1100, respectively, in FIG. 2A, the first reference voltage VREFH and the second reference voltage VREFL may also be generated by the controller 1200 (in FIG. 1) and provided to the non-volatile memory device 1100. The sense amplification circuit block 1150 includes a plurality of sense amplification circuits corresponding to the bit lines BL, and each of the sense amplification circuits receive the data voltage and the first and second reference voltages VREFH and VREFL through an input terminal.

The sense amplification circuit generates a differential output signal (also referred to hereinafter as "differential output signals") according to a voltage level difference between the data voltage and the first and second reference voltages VREFH and VREFL. In other words, the sense amplification circuit generates the differential output signal by differentially amplifying the data voltage input as a single signal. The differential output signal may be generated by using at least one capacitor for storing voltages corresponding to the voltage level difference between the data voltage and the first and second reference voltages VREFH and VREFL, and to this end, the sense amplification circuit may include an integration circuit for integrating voltages by using the at least one capacitor. Read data is generated by sensing/amplifying the differential output signal at a predetermined point of time. The detailed operation of the sense amplification circuit block 1150 will be described later.

FIG. 2B is a circuit diagram illustrating a unit cell shown in FIG. 2A, and as shown in FIG. 2B, the memory cell 1111 may include an MTJ and a CT. A gate of the CT is connected to a word line (for example, a first word line BL0), and an electrode of the CT is connected to a bit line (for example, a first bit line BL0) through the MTJ. Another electrode of the CT is connected to a source line (for example, a first source line SL0). A current for writing data may be delivered in a direction from a bit line to a source line or in a direction from a source line to a bit line. According to a direction in which current is delivered, the direction of a vector formed in the MTJ is determined, and in a subsequent data read operation, a resistance value formed in the MTJ varies according to the determined direction of the vector.

FIG. 2C is a cross-sectional view of a structure of the MTJ of the unit cell shown in FIG. 2B. As shown in FIG. 2C, the MTJ may include a fixed layer 1111_1, a free layer 1111_2, and a tunnel layer 1111_3 disposed therebetween. The MTJ may further include a first electrode E1 contacting the fixed layer 1111_1 and a second electrode E2 contacting the free layer 1111_2. Although not shown in FIG. 2C, an anti-ferromagnetic layer may be further provided, for example between the first electrode E1 and the fixed layer 1111_1, to fix the magnetizing direction of the fixed layer 1111_1.

The magnetizing direction of the fixed layer 1111_1 is fixed, and the magnetizing direction of the free layer 1111_2 may be the same as or opposite to the magnetizing direction of the fixed layer 1111_1. Write currents WC1 and WC2 may be applied between the first electrode E1 and the second electrode E2, and the magnetizing direction of the free layer 1111_2 is determined according to the directions of the write currents WC1 and WC2. For example, upon application of the write current WC1 from the second electrode E2 to the first electrode E1, the free layer 1111_2 may be magnetized in the same magnetizing direction as the fixed layer 1111_1.

The resistance value of the MTJ varies according to the magnetizing direction of the free layer 1111_2. For example, if the magnetizing direction of the free layer 1111_2 is the same as that of the fixed layer 1111_1, the resistance value of the MTJ is low, which may correspond to storage of data '0'. On the other hand, if the magnetizing direction of the free layer 1111_2 is opposite to that of the fixed layer 1111_1, the resistance value of the MTJ is high, which may correspond to storage of data '1'.

Figure 3:
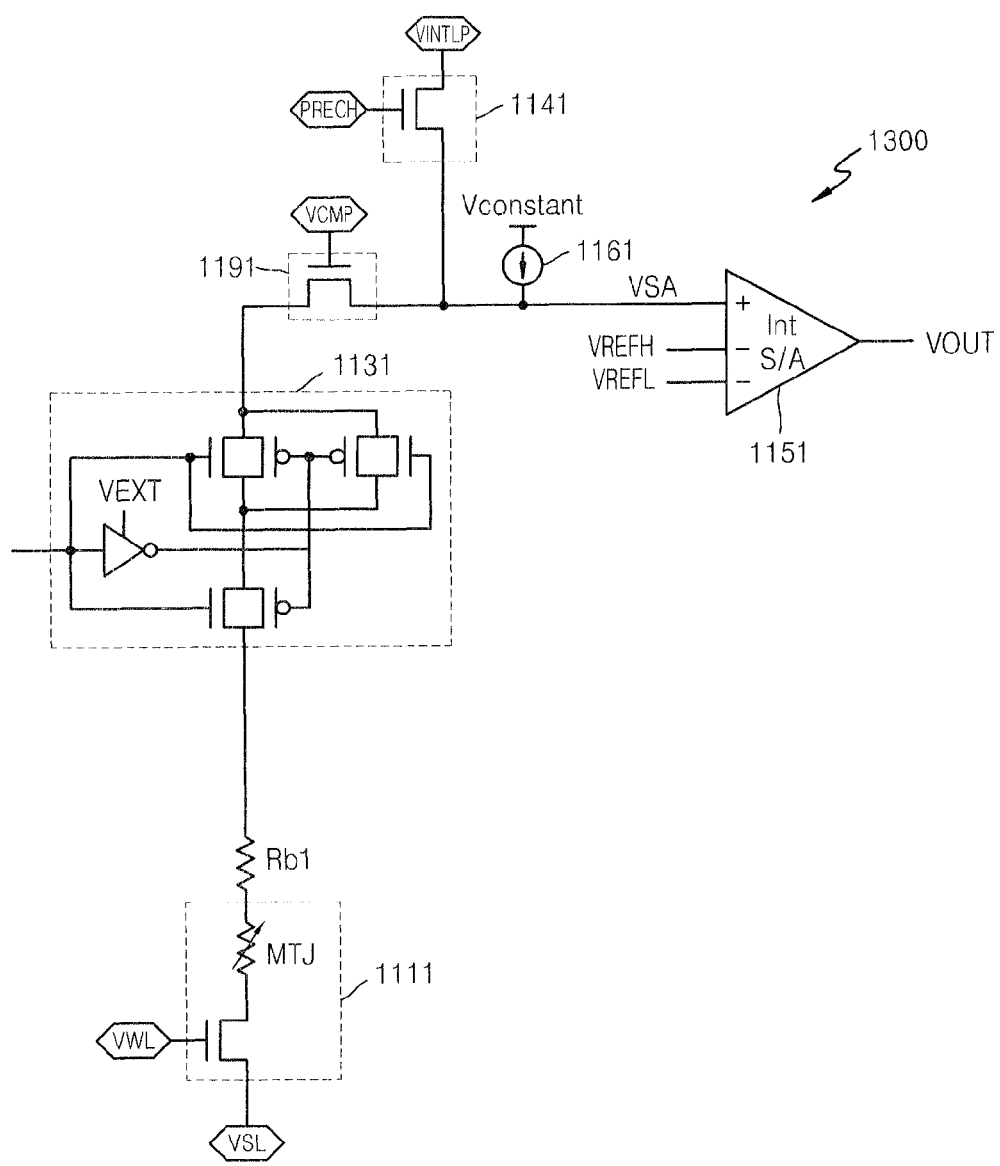
FIG. 3 is a circuit diagram illustrating a data read circuit that may be included in a non-volatile memory device according to an exemplary embodiment of the inventive concept.

FIG. 3 is a circuit diagram illustrating a data read circuit 1300 that may be included in a non-volatile memory device according to an exemplary embodiment of the inventive concept. The data read circuit 1300 may include circuits disposed on a read path to engage in a data read operation. The data read circuit 1300 may include at least some of the components shown in FIG. 2A or other components not shown in FIG. 2A. Although the data read circuit 1300 for reading data of a single memory cell 1111 is shown in FIG. 3, a plurality of data read circuits for reading data in parallel from the plurality of memory cells 1111 may be provided in the non-volatile memory device 1100.

With reference to FIGS. 1 and 3, a detailed structure and operation of the data read circuit 1300 will be described.

As shown in FIG. 3, the data read circuit 1300 may include a pre-charge circuit 1141 connected to a bit line to pre-charge the bit line to a predetermined level, a bit line selection circuit 1131 for selecting a bit line, a clamping circuit 1191 for clamping a bit line, a current source 1161 for providing current to a bit line, and a sense amplification circuit 1151 for receiving a data voltage VSA and at least two reference voltages VREFH and VREFL and performing sensing/amplifying operations in response thereto. A resistance Rb1 shown in FIG. 3 indicates a resistance component resulting from a bit line, and an output VOUT of the sense amplification circuit 1151 is latched by a latch circuit and provided as read data to the outside.

The pre-charge circuit 1141 may be disposed to correspond to each bit line, and may be included in the pre-charge circuit unit 1140 shown in FIG. 2A. The bit line selection circuit 1131 is a circuit that is on/off-controlled in response to a decoding result of a column address, and may be included in the column decoder 1130 shown in FIG. 2A. The clamping circuit 1191 may also be disposed to correspond to each bit line, and the sense amplification circuit 1151 is intended to sense and amplify the data voltage VSA of each bit line and may be included in the sense amplification circuit block 1150 shown in FIG. 2A. The current source 1161 may be included in the current generation unit 1160 shown in FIG. 2A, or the current generated in the current generation unit 1160 may be commonly provided to a plurality of bit lines.

According to an exemplary embodiment of the inventive concept, the non-volatile memory device 1100, when reading the data stored in the memory cell 1111, performs sensing/amplifying operations using the at least two reference voltages VREFH and VREFL. The non-volatile memory device 1100 also performs an integrating operation according to a voltage level difference between the data voltage VSA and the at least two reference voltages VREFH and VREFL, and generates a differential output signal obtained by differentially amplifying the data voltage VSA based on the integrating operation. The non-volatile memory device 1100 also generates the output VOUT by performing sensing/amplifying operations with respect to the differential output signal. To this end, the sense amplification circuit 1151 may include a first sense amplifier for generating the differential output signal in response to the data voltage VSA and a second sense amplifier for generating the output VOUT by sensing/amplifying the differential output signal. The first sense amplifier may be implemented with an integration circuit which performs a differential amplification operation with respect to input signals including the data voltage VSA and the at least two reference voltages VREFH and VREFL.

The detailed operation of the data read circuit 1300 shown in FIG. 3 will now be described. Assume that the at least two reference voltages VREFH and VREFL are the first and second reference voltages VREFH and VREFL.

A bit line connected to the memory cell 1111 is pre-charged to a predetermined level, and then the bit line selection circuit 1131 is selected to read data of the memory cell 1111. A predetermined voltage is provided to a gate of the clamping circuit 1191, and the current source 1161 provides a current having a predetermined level to a first input terminal (e.g., an input terminal for receiving the data voltage VSA) of the sense amplification circuit 1151. The MTJ of the memory cell 1111 has a resistance value that varies according to stored data, and the data voltage VSA of the first input terminal of the sense amplification circuit 1151 is developed according to the resistance value of the MTJ.

Second and third input terminals of the sense amplification circuit 1151 receive the first and second reference voltages VREFH and VREFL. As mentioned above, the first and second reference voltages VREFH and VREFL may be generated in the non-volatile memory device 1100 by using a predetermined power voltage provided from the outside, or they may be provided directly from the outside.

In the sense amplification circuit 1151, the level of the data voltage VSA is compared with the level of the first reference voltage VREFH and the level of the second reference voltage VREFL, and a differential output signal is generated by performing an integrating operation according to a voltage level difference. By sensing and amplifying the differential output signal at a particular point in time during the generation of the differential output signal, the output VOUT is generated. The first and second reference voltages VREFH and VREFL may have particular voltage levels, and as the data voltage VSA is developed, the voltage level difference occurs between the data voltage VSA and the first and second reference voltages VREFH and VREFL.

Figure 4:
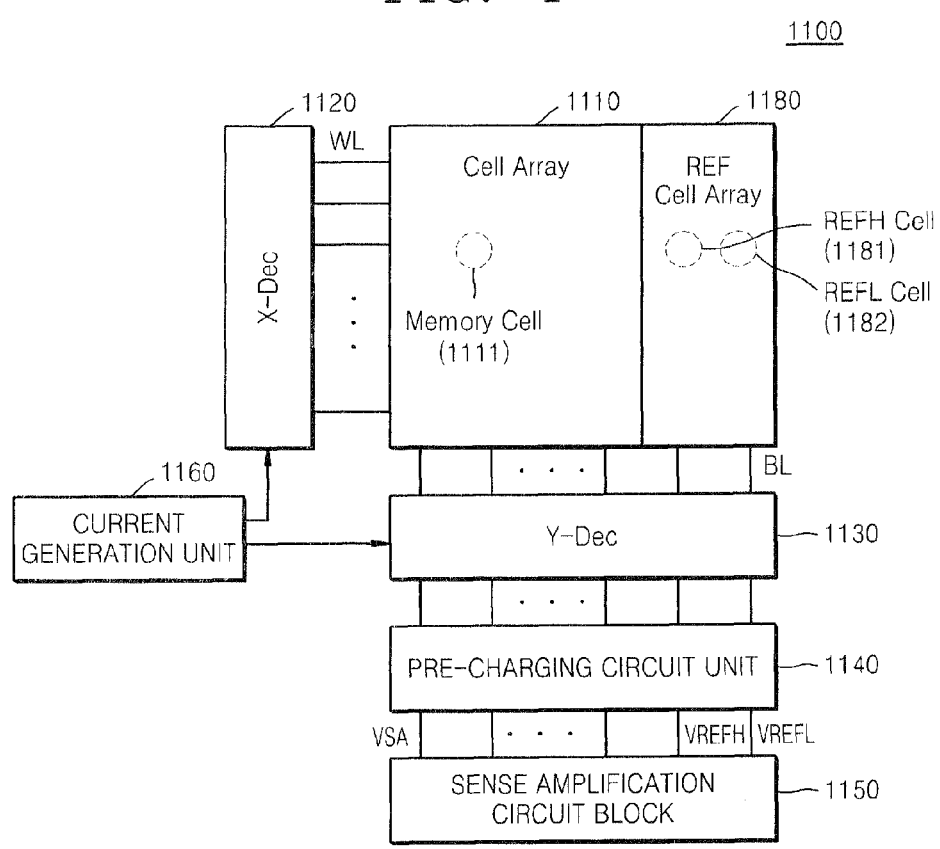
FIG. 4 is a block diagram illustrating a non-volatile memory device according to an exemplary embodiment of the inventive concept.
Figure 5:
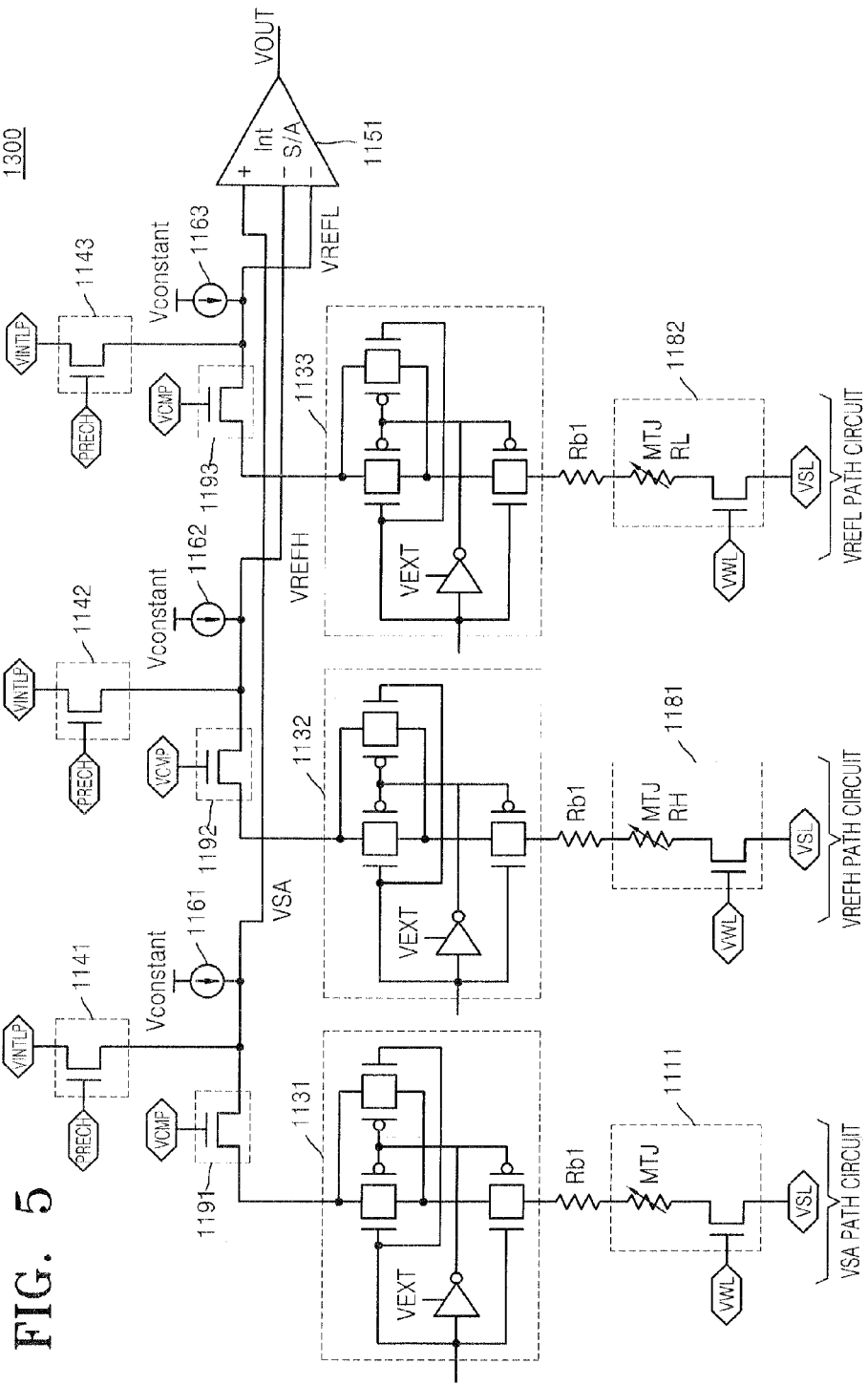
FIG. 5 is a circuit diagram illustrating a data read circuit of the non-volatile memory device illustrated in FIG. 4 according to an exemplary embodiment of the inventive concept.

FIG. 4 is a block diagram of a non-volatile memory device according to an exemplary embodiment of the inventive concept. FIG. 5 is a circuit diagram of a data read circuit of the non-volatile memory device shown in FIG. 4 according to an exemplary embodiment of the inventive concept. When a structure and operation of the non-volatile memory device shown in FIGS. 4 and 5 are described, the same components as those shown in. FIGS. 2A, 2B, and 2C will not be described in detail.

As shown in FIG. 4, the non-volatile memory device 1100 includes the cell array 1110 for storing data, the row decoder 1120 for selecting a word line WL, and the column decoder 1130 for selecting a bit line BL. The non-volatile memory device 1100 may further include the pre-charge circuit unit 1140 for pre-charging a bit line BL to a predetermined level, the sense amplification circuit 1150 for sensing/amplifying data of a bit line BL of a memory cell 1111 in the cell array 1110, and the current generation unit 1160 for generating current provided to a word line WL and/or a bit line BL. The cell array 1110 includes a plurality of memory cells (for example, MRAM cells) 1111 for storing data.

The non-volatile memory device 1100 shown in FIG. 4 generates reference voltages for reading data (for example, the first and second reference voltages VREFH and VREFL) from the MRAM cell 1111. To this end, the non-volatile memory device 1100 further includes a reference cell array 1180 which includes a plurality of reference cells for providing the first and second reference voltages VREFH and VREFL. The memory cell 1111 of the cell array 1110 for storing data and a reference cell of the reference cell array 1180 may have the same cell structure.

In reference cells 1181 and 1182 of the reference cell array 1180 may be stored data corresponding to logic high or logic low. For example, logic high data may be written in a cell (e.g., first cell 1181) of the reference cell array 1180 and logic low data may be written in another cell (e.g., second cell 1182) of the reference cell array 1180. In the reference cell array 1180, pairs of the first reference cell 1181 and the second reference cell 1182 may be included to correspond to at least some of the word lines WL, or pairs of the first reference cell 1181 and the second reference cell 1182 may be included to correspond to each of the word lines WL. Thus, in a data read operation with respect to the cell array 1110, information written on the first reference cell 1181 and the second reference cell 1182 of the reference cell array 1180 is also read.

A data write operation with respect to the first and second reference cells 1181 and 1182 may be performed during a data write operation with respect to the memory cell 1111. The data write operation with respect to the first and second reference cells 1181 and 1182 may be performed once initially, and by repetitively reading the first and second reference cells 1181 and 1182 on which the data write operation is performed once, the first and second reference voltages VREFH and VREFL may be obtained. When a word line WL of the cell array 1110 is selected, the first and second reference cells 1181 and 1182 may also be selected, such that in a data write operation with respect to the selected word line WL of the cell array 1110, the selected first and second reference cells 1181 and 1182 may also be written. In other words, the data write operation with respect to the first and second reference cells 1181 and 1182 may be repeated every data update. In the case of a memory such as an MRAM, a data value (e.g., a resistance value of an MTJ) stored in the memory cell 1111 or the first and second reference cells 1181 and 1182 may change over time. As a result, a data re-write operation may be performed on the memory cell 1111 according to a predetermined time period, and during the data re-write operation with respect to the memory cell 1111, a data re-write operation with respect to the first and second reference cells 1181 and 1182 may also be performed.

Bit lines BL are additionally disposed to correspond to the reference cell array 1180, and a pre-charging operation and a selecting operation with respect to these bit lines BL are performed identically or similarly to the bit lines BL corresponding to the cell array 1110 which stores data. In the data read operation, the column decoder 1130 selects bit lines BL connected to the first reference cell 1181 and the second reference cell 1182. Voltages of the bit lines BL connected to the first reference cell 1181 and the second reference cell 1182 are developed, and the developed voltages are provided to the sense amplification circuit block 1150 as the first reference voltage VREFH and the second reference voltage VREFL, respectively. The sense amplification circuit block 1150 includes a plurality of sense amplification circuits, each of which receives the first and second reference voltages VREFH and VREFL together with the data voltage VSA corresponding thereto.

One of logic-high data and logic-low data is stored in the memory cell 1111, the first reference cell 1181 stores logic-high data, and the second reference cell 1182 stores logic-low data. According to the data stored in the memory cell 1111, the data voltage VSA has approximately the same level as one of the first reference voltage VREFH and the second reference voltage VREFL, and has a level different than the other thereof. When a differential amplification operation is performed according to a voltage level difference between the data voltage VSA and the first and second reference voltages VREFH and VREFL, if, for example, logic-high data is stored in the memory cell 1111, a differential output signal corresponding mostly to a voltage level difference between the data voltage VSA and the second reference voltage VREFL is generated.

A structure and operation of the data read circuit 1300 shown in FIG. 5 will now be described. The data read circuit 1300 may include a read (VSA) path circuit for generating the data voltage VSA according to data stored in the memory cell 1111, a first reference (VREFH) path circuit for generating the first reference voltage VREFH, and a second reference (VREFL) path circuit for generating the second reference voltage VREFL. The first reference (VREFH) path circuit and the second reference (VREFL) path circuit may include the same circuits as those included in the read (VSA) path circuit. For example, as shown in FIG. 5, the first reference (VREFH) path circuit may include a pre-charge circuit 1142, a bit line selection circuit 1132, a clamping circuit 1192, and a current source 1162, which are connected to the first reference cell 1181, and the second reference (VREFL) path circuit may include a pre-charge circuit 1143, a bit line selection circuit 1133, a clamping circuit 1193, and a current source 1163, which are connected to the second reference cell 1182. While current sources 1161 through 1163 are shown as being different current sources, a current from a common current source, which is one of these current sources 1161 through 1163, may be used.

The data voltage VSA is provided to a first input terminal of the sense amplification circuit 1151 through a bit line (e.g., a first bit line) connected to the memory cell 1111. The first and second reference voltages VREFH and VREFL are provided to second and third input terminals of the sense amplification circuit 1151 via bit lines (e.g., first and second reference bit lines) connected to the first and second reference cells 1181 and 1182. The sense amplification circuit 1151 generates the output VOUT based on the integrating and sensing/amplifying operations described above.

According to the structure shown in FIG. 5, a pair of first and second reference cells 1181 and 1182 is disposed to correspond to a plurality of memory cells 1111 of the cell array 1110, and thus an area penalty is not large. For example, multiple memory cells 1111 and the first and second reference cells 1181 and 1182 may be disposed to correspond to a single word line, and a plurality of sense amplification circuits 1151 for sensing data of the memory cells 1111 may commonly use the first and second reference voltages VREFH and VREFL generated in the first and second reference cells 1181 and 1182, respectively.

Figure 6:
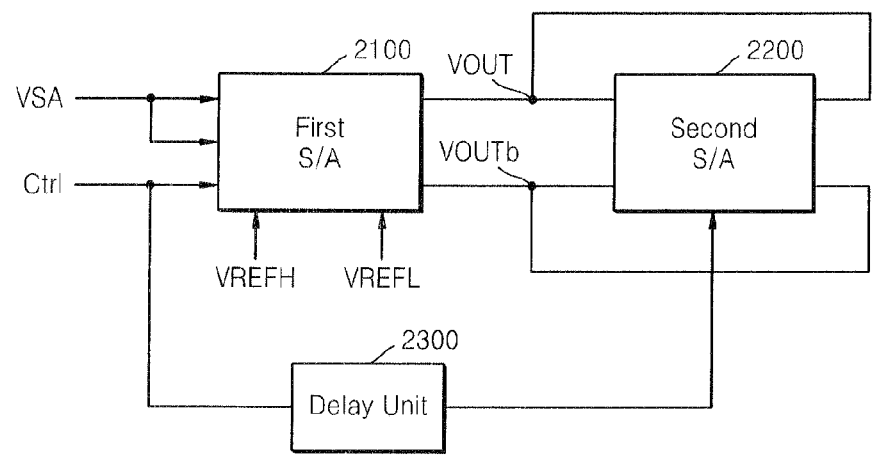
FIG. 6 is a block diagram of a sense amplification circuit included in a data read circuit according to an exemplary embodiment of the inventive concept.

FIG. 6 is a block diagram of a sense amplification circuit included in a data read circuit according to an exemplary embodiment of the inventive concept.

As shown in FIG. 6, the sense amplification circuit 1151 may be disposed to correspond to each of a plurality of bit lines, and may include a first sense amplifier 2100 and a second sense amplifier 2200. A delay unit 2300 for controlling an enable timing of the first sense amplifier 2100 and/or the second sense amplifier 2200 may be further included in the sense amplification circuit 1151. The first sense amplifier 2100 receives the data voltage VSA, and the first and second reference voltages VREFH and VREFL, and generates differential output signals VOUT and VOUTb developed according to a voltage level difference between the data voltage VSA and the at least two reference voltages VREFH and VREFL.

For example, when the first and second reference voltages VREFH and VREFL are generated by reference cells as shown in FIG. 4, the differential output signals VOUT and VOUTb are generated according to a voltage level difference between the data voltage VSA and primarily one of the first and second reference voltages VREFH and VREFL. The second sense amplifier 2200 senses/amplifies the differential output signals VOUT and VOUTb and outputs the sensed/amplified signals. Although output terminals of the first and second sense amplifiers 2100 and 2200 are shared and the input terminal and the output terminal of the second sense amplifier 2200 are coupled to each other in FIG. 6, the exemplary embodiment of the inventive concept is not limited thereto. For example, the second sense amplifier 2200 may output the sensed and amplified signals of the differential output signals VOUT and VOUTb through another output terminal.

A control signal Ctrl for enabling the first sense amplifier 2100 is provided to the first sense amplifier 2100, and the control signal Ctrl is provided to the second sense amplifier 2200 through the delay unit 2300. Thus, the second sense amplifier 2200 is enabled after a predetermined delay. After the differential output signals VOUT and VOUTb are developed according to the differential amplifying operation of the first sense amplifier 2100 and the second sense amplifier 2200 is enabled after the predetermined delay, the differential output signals VOUT and VOUTb are sensed/amplified by the second sense amplifier 2200. In this way, by sensing/amplifying sufficiently developed differential output signals VOUT and VOUTb, the accuracy of read data may be improved. Moreover, by latching the amplified differential output signals VOUT and VOUTb at a predetermined point in time, a read data signal having a full digital voltage level may be generated.

Figure 7:
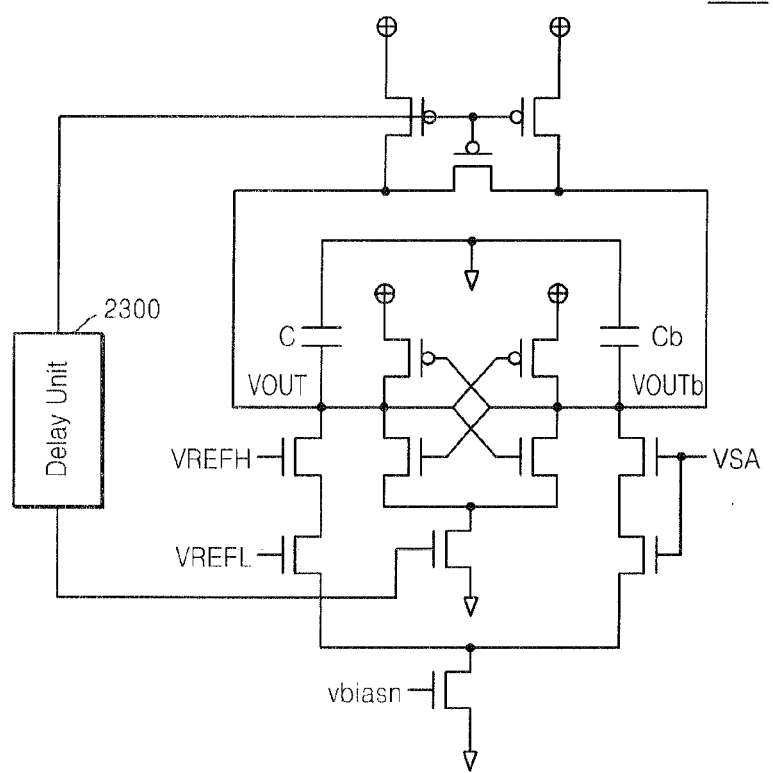

FIGS. 7 and 8 are circuit diagrams illustrating the sense amplification circuit 1151 shown in FIG. 6 according to an exemplary embodiment of the inventive concept. FIG. 7 is a circuit diagram illustrating the sense amplification circuit 1151 shown in FIG. 6, and FIG. 8 includes circuit diagrams (a) and (b) respectively showing the first sense amplifier 2100 and the second sense amplifier 2200 of FIG. 7, which are separated from each other. Referring to FIGS. 7 and 8, a structure and operation of the sense amplification circuit 1151 will be described.

The sense amplification circuit 1151 may include the first sense amplifier 2100, the second sense amplifier 2200, and the delay unit 2300. The first sense amplifier 2100 may include a first input unit 2110 for receiving a data voltage VSA corresponding to a data value stored in a memory cell, a second input unit 2120 for receiving the first and second reference voltages VREFH and VREFL, and a biasing unit 2130 for biasing the first sense amplifier 2100. The first sense amplifier 2100 may include one or more capacitors 2141 and 2142 for storing the differential-amplification signals based on differences between the data voltage VSA and the first and second reference voltages VREFH and VREFL, and a pre-charging unit 2150 for pre-charging a differential output terminal (also referred to hereinafter as "differential output terminals") to a predetermined level.

The first input unit 2110 includes a plurality of input terminals for receiving the data voltage VSA. For example, the first input unit 2110 includes two Metal Oxide Semiconductor (MOS) transistors of a stacked structure, and the data voltage VSA is provided to gates of the two MOS transistors. The second input unit 2120 includes a plurality of input terminals for receiving the first and second reference voltages VREFH and VREFL, and for example, the second input unit 2120 also includes two MOS transistors of a stacked structure. The first reference voltage VREFH and the second reference voltage VREFL are provided to gates of the two MOS transistors of the second input unit 2120, respectively. The first capacitor 2141 is connected to the first input unit 2110 through a first differential output terminal, and the second capacitor 2142 is connected to the second input terminal 2120 through a second differential output terminal.

Prior to a data read operation, the pre-charging unit 2150 of the first sense amplifier 2100 is activated in response to the control signal Ctrl, and the differential output terminal (e.g., the first and second differential output terminals) of first sense amplifier 2100 is pre-charged to a predetermined pre-charge voltage. Thereafter, according to a voltage level difference between the data voltage VSA provided to the first input unit 2110 and the first and second reference voltages VREFH and VREFL provided to the second input unit 2120, a value of a current passing through the differential output terminal changes and thus a level of a voltage applied to the differential output terminal also changes. The changed voltage is stored in the first capacitor 2141 and the second capacitor 2142.

For example, if the first and second reference voltages VREFH and VREFL are generated from a reference cell array and data of a memory cell has a logic-high value, the data voltage VSA and the first reference voltage VREFH have substantially the same level and thus an integrating operation is performed based mostly on a voltage level difference between the data voltage VSA and the second reference voltage VREFL. As a result of the integrating operation, a voltage difference between the differential output signals VOUT and VOUTb gradually increases.

The second sense amplifier 2200 is enabled after a predetermined delay from when the pre-charge unit 2150 of the first sense amplifier 2100 is enabled. For example, the control signal Ctrl provided to the pre-charging unit 2150 passes through the delay unit 2300 and is provided to a biasing unit 2220 of the second sense amplifier 2200. In other words, to secure time for the integrating operation of the first sense amplifier 2100, an enabling point of time for the second sense amplifier 2200 is adjusted (or a sensing point of time for the differential output signals VOUT and VOUTb is adjusted). Once the differential output signals VOUT and VOUTb, which are outputs of the first sense amplifier 2100, are sufficiently developed, the second sense amplifier 2200 is enabled and the second sense amplifier 2200 senses/amplifies the differential output signals VOUT and VOUTb, thus generating the amplified differential output signals VOUT and VOUTb. The amplified differential output signals VOUT and VOUTb may be latched at a point in time after the sensing operation using latch 2210, and the latched signals may be provided as read data to the outside.

While in FIG. 8, the delay unit 2300 is implemented using a plurality of inverters and a sensing time is adjusted by delaying the control signal Ctrl that controls the pre-charging unit 2150 of the first sense amplifier 2100, the exemplary embodiment of the inventive concept is not necessarily limited thereto. For example, the pre-charging unit 2150 of the first sense amplifier 2100 and the biasing unit 2220 of the second sense amplifier 2200 may be controlled by different control signals, and when activation timings for these control signals are adjusted, the delay unit 2300 may not be required. Further, the delay unit 2300 may be constructed of other forms of time delay circuitry. In the case of the first sense amplifier 2100 and the second sense amplifier 2200 for sensing/amplifying an input signal, their voltage gains may be changed according to characteristics of elements such as MOS transistors included in the first and second sense amplifiers 2100 and 2200. By adjusting a voltage gain for an amplifying operation, output waveforms of the first and second sense amplifiers 2100 and 2200 may be changed.

Figure 9A:
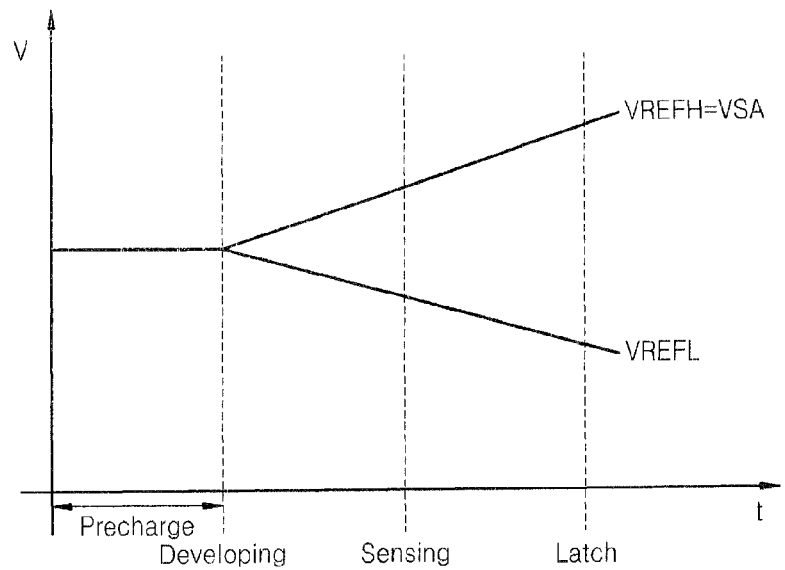
FIGS. 9A, 9B, 10A and 10B are graphs showing input/output waveforms of the sense amplification circuit shown in FIG. 6 according to exemplary embodiments of the inventive concept.
Figure 9B:
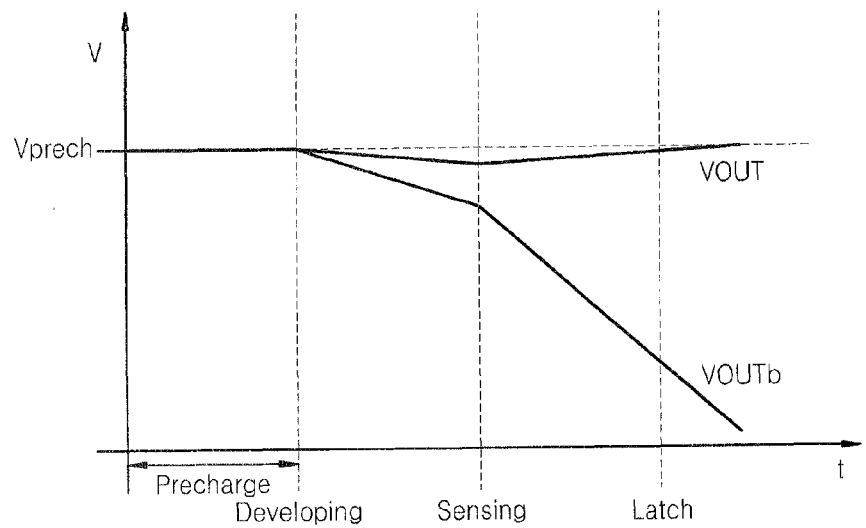
Figure 10A:
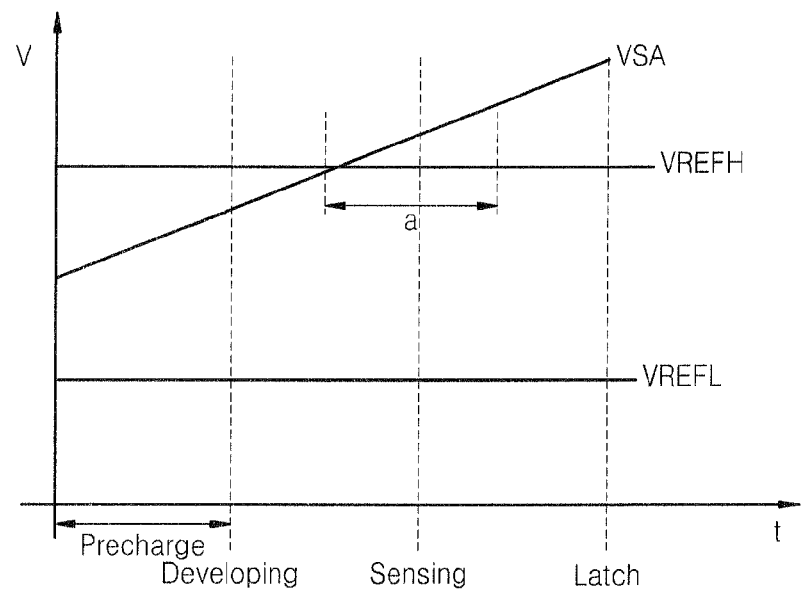
Figure 10B:
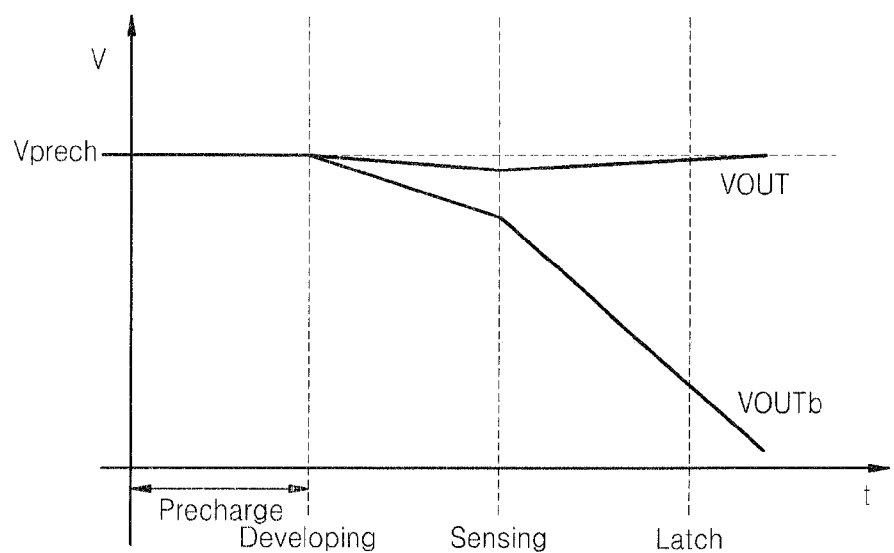

FIGS. 9A, 9B, 10A and 10B are graphs showing input/output waveforms of the sense amplification circuit 1151 shown in FIG. 6 according to an exemplary embodiment of the inventive concept. FIGS. 9A and 9B are graphs for a case when the first and second reference voltages VREFH and VREFL are generated from a reference cell array like that shown in FIG. 4, and FIGS. 10A and 10B are graphs for a case when the first and second reference voltages VREFH and VREFL are generated from reference voltage generation units like those shown in FIG. 2A. Referring to FIGS. 7 through 10B, an operation of the sense amplification circuit 1151 will be described. It is assumed that logic-high data is stored in a memory cell.

As shown in FIGS. 9A and 9B, the differential output signals VOUT and VOUTb of the first sense amplifier 2100 maintain a pre-charge level Vprech prior to a develop stage. Upon selection of a memory cell for a data read operation, the data voltage VSA of a bit line connected to the memory cell is developed. As a first reference cell and a second reference cell are selected together with the selection of the memory cell, the first reference voltage VREFH and the second reference voltage VREFL are developed. The data voltage VSA has substantially the same value as the first reference voltage VREFH.

According to a change in the voltage level difference between the data voltage VSA and the second reference voltage VREFL, the differential output signals VOUT and VOUTb are developed, and after a predetermined delay, a sensing operation is performed. The sensing operation may be performed by enabling the second sense amplifier 2200, and through the sensing operation, the differential output signals VOUT and VOUTb are amplified to a full digital level. The amplified differential output signals VOUT and VOUTb are latched at a predetermined point in time after the sensing operation, and latched information is provided as read data to the outside.

As shown in FIGS. 10A and 10B, the first reference voltage VREFH and the second reference voltage VREFL generated from reference voltage generation units have constant voltage levels. When a memory cell is selected for a data read operation, the data voltage VSA of a bit line connected to the memory cell is developed and the level of the data voltage VSA gradually increases, such that at a predetermined point in time, the level of the data voltage VSA exceeds the level of the first reference voltage VREFH.

The differential output signals VOUT and VOUTb of the first sense amplifier 2100 maintain the pre-charge level Vprech prior to a develop stage, and are developed as the data voltage VSA changes. A sensing operation is performed after a predetermined delay from development of the differential output signals VOUT and VOUTb. The sensing operation may be performed within a predetermined time from when the data voltage VSA has the same level as the first reference voltage VREFH. Through the sensing operation, the differential output signals VOUT and VOUTb are amplified to a full digital level, and the amplified differential output signals VOUT and VOUTb are latched at a predetermined point in time after the sensing operation. Latched information is provided as read data to the outside.

Figure 11A:
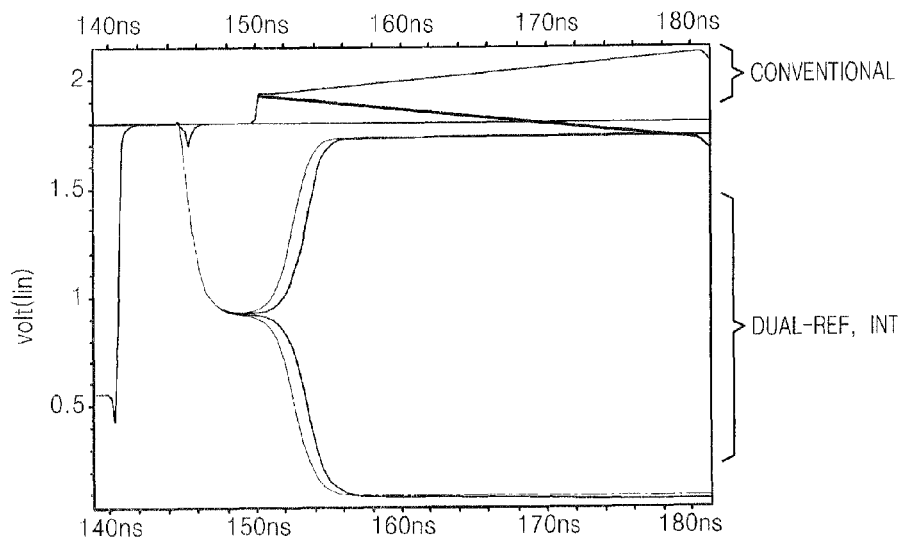
FIG. 11A is a graph for comparing a data signal waveform of a conventional data read circuit with a data signal waveform of a data read circuit according to an exemplary embodiment of the inventive concept.
Figure 11B:
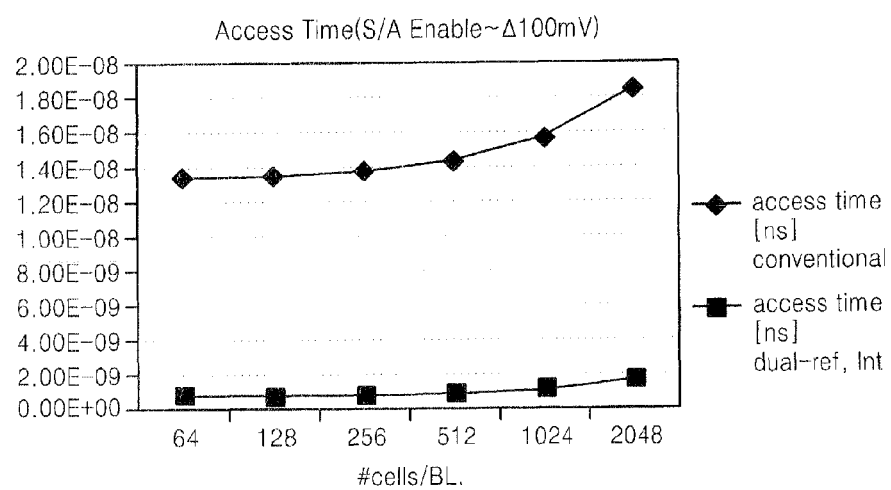
FIG. 11B is a graph for comparing an access time in a conventional data read operation with an access time in a data read operation according to an exemplary embodiment of the inventive concept.

FIG. 11A is a graph for comparing a data signal waveform of a conventional data read circuit with a data signal waveform of a data read circuit according to an exemplary embodiment of the inventive concept, and FIG. 11B is a graph for comparing an access time in a conventional data read operation with an access time in a data read operation according to an exemplary embodiment of the inventive concept.

As shown in FIG. 11A, in a sense amplification circuit according to an exemplary embodiment of the inventive concept, since a differential output signal stored in an integrating capacitor is directly provided as an input of a sense amplifier for sensing/amplifying operations, the differential output signal is amplified by a large gain, and thus it may be immediately developed to a full digital level. Consequently, by applying an exemplary embodiment of the inventive concept, a development speed and a full digital voltage restoring capability are superior to a conventionally designed data read circuit.

An access time with respect to a conventional case and an access time with respect to an exemplary embodiment of the inventive concept are shown in FIG. 11B. The access time may be defined as a time from when a sense amplifier is enabled to when a developed voltage difference reaches 100 mV. When the number of cells per bit line increases, the access time also increases as a whole. However, according to an exemplary embodiment of the inventive concept, the access time may be reduced to 2 ns or less overall.

Figure 12:
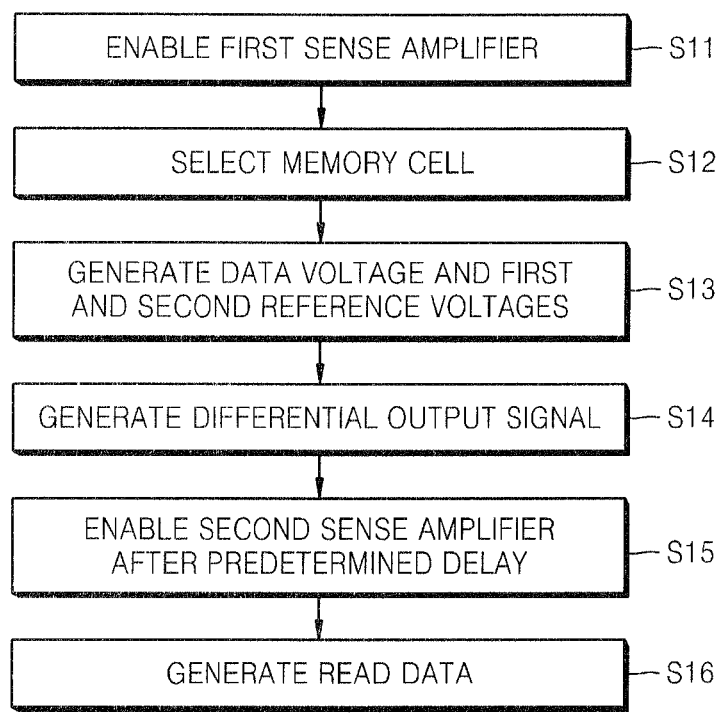
FIGS. 12 and 13 are flowcharts illustrating a method of reading data from a non-volatile memory device according to an exemplary embodiment of the inventive concept.
Figure 13:
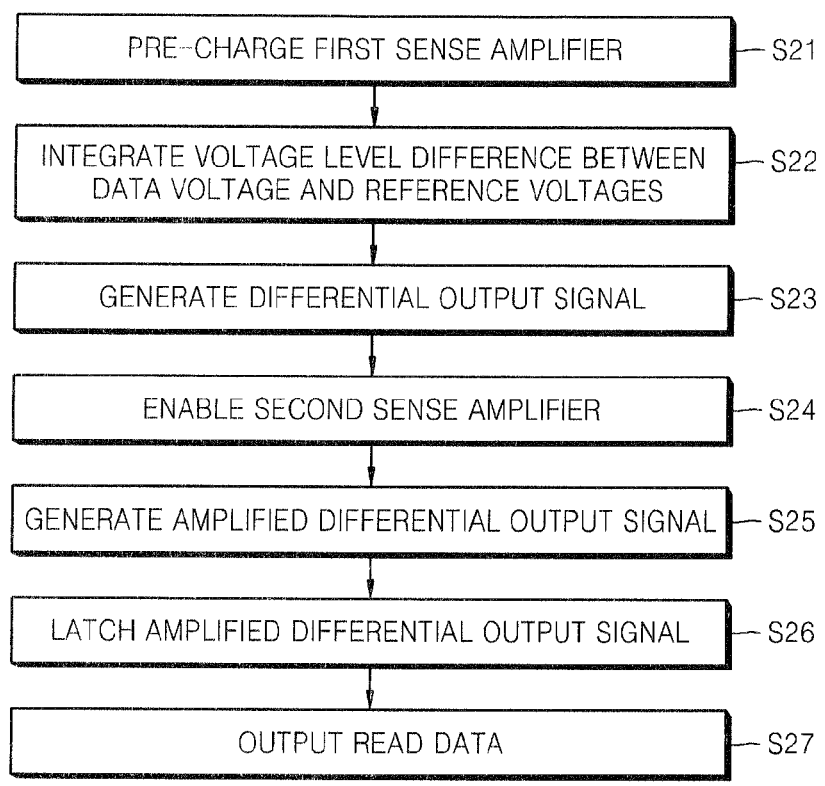

FIGS. 12 and 13 are flowcharts illustrating a method of reading data from a non-volatile memory device according to an exemplary embodiment of the inventive concept.

According to the method, a data voltage originating from a memory cell and at least two reference voltages are provided to a sense amplification circuit. The sense amplification circuit may include a first sense amplifier for differentially amplifying voltage level differences between the data voltage and the first and second reference voltages, and a second sense amplifier for receiving and sensing/amplifying an output of the first sense amplifier. The first sense amplifier may be implemented with an integration circuit for generating a differential output signal corresponding to the data voltage and outputting the differential output signal through a differential output terminal. The second sense amplifier may be implemented with an amplification circuit for receiving the differential output signal through the differential output terminal, amplifying the received differential output signal, and outputting the amplified signal through the differential output terminal.

As a predetermined control signal is provided to the first sense amplifier, the first sense amplifier is enabled in operation S11. The first sense amplifier may include a pre-charging unit for pre-charging the differential output terminal to a predetermined level, and the predetermined control signal may be a pre-charge control signal for activating the pre-charging unit. In operation S12, a memory cell is selected according to a result of decoding an address provided from the outside. A data voltage corresponding to data stored in the selected memory cell is generated, and the first reference voltage and the second reference voltage are generated to read the data stored in the memory cell in operation S13. The first reference voltage and the second reference voltage may be generated from reference voltage generation units which generate predetermined direct current (DC) voltage values as in the foregoing embodiments, or may be voltages developed by reference cells which store logic-high information and logic-low information.

The first sense amplifier receives the data voltage and the first and second reference voltages and amplifies a voltage level difference between the data voltage and the first and second reference voltages, thus generating differential output signals in operation S14. The first sense amplifier may include two input terminals for commonly receiving the data voltage and two input terminals for receiving the first reference voltage and the second reference voltage, respectively. The first sense amplifier may be implemented with an integration circuit for performing an integrating operation by using one or more capacitors, and stores a voltage corresponding to the integrating operation in the one or more capacitors. A voltage level stored in each of the one or more capacitors changes according to a voltage level difference between the data voltage and the first and second reference voltages, and for example, if first and second capacitors are included in the first sense amplifier, a voltage at a node of the first capacitor and a voltage at a node of the second capacitor may be generated as differential output signals.

After a predetermined delay, the second sense amplifier is enabled in operation S15. The delay may be adjusted by a delay means such as an inverter chain. The delay may be a time from when the first sense amplifier is enabled (or a pre-charging unit of the first sense amplifier is activated) to when a bias voltage is applied to the second sense amplifier. In this case, a signal obtained by delaying the pre-charge control signal may be used as a control signal for controlling the biasing of the second sense amplifier.

The second sense amplifier is connected to a differential output terminal of the first sense amplifier to receive the differential output signal. At the point of time when the second sense amplifier is enabled, the differential output signal is sensed and the amplified differential output signal is generated as read data in operation S16. The output terminal of the second sense amplifier may be commonly connected to the differential output terminal of the first sense amplifier, so that the read data may be output through the differential output terminal.

FIG. 13 is a flowchart illustrating detailed operations of the first sense amplifier and the second sense amplifier. As shown in FIG. 13, a pre-charging operation is performed with respect to the first sense amplifier according to the pre-charge control signal in operation S21. The pre-charging operation may be performed by pre-charging a level of the differential output terminal to a predetermined level.

As the data voltage and the first and second reference voltages are provided to the first sense amplifier, an operation of integrating a voltage level difference between the data voltage and the first and second reference voltages is performed in operation S22. When the first and second reference voltages are generated from reference cells, a level of one of the first and second reference voltages has approximately the same value as the level of the data voltage and a level of the other reference voltage has a different value than the level of the data voltage. For example, if logic-high data is stored in a memory cell, the data voltage has approximately the same level as the level of the first reference voltage, such that a voltage level difference between the data voltage and the second reference voltage is mostly integrated. The first sense amplifier generates a differential output signal corresponding to the integrating operation in operation S23.

After a predetermined delay from when the pre-charging is performed, the second sense amplifier is enabled in operation S24. The second sense amplifier receives the differential output signal from the first sense amplifier, and senses and amplifies the differential output signal after the predetermined delay, thus generating the amplified differential output signal in operation S25. At a predetermined point in time from the start of the amplifying operation, the amplified differential output signal is latched in operation S26, and the latched differential output signal is output as read data in operation S27.

Figure 14:
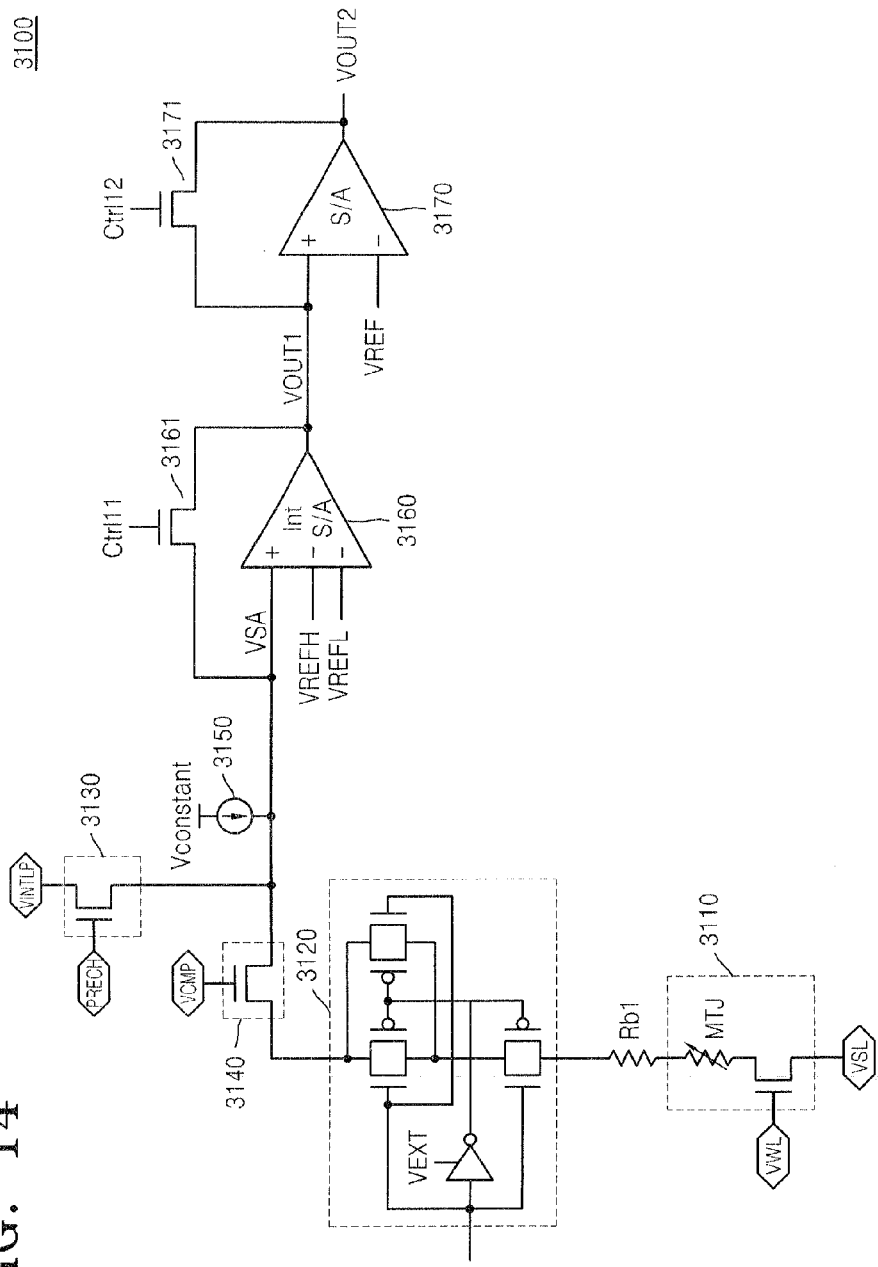
FIG. 14 is a circuit diagram illustrating a data read circuit that may be included in a non-volatile memory device according to an exemplary embodiment of the inventive concept.

FIG. 14 is a circuit diagram illustrating a data read circuit that may be included in a non-volatile memory device according to an exemplary embodiment of the inventive concept. As shown in FIG. 14, a data read circuit 3100 may be disposed to correspond to each of a plurality of bit lines included in the non-volatile memory device 1100.

The data read circuit 3100 may include various circuits for reading data from a memory cell 3110, for example, a pre-charging circuit 3130 connected to a bit line to pre-charge the bit line to a predetermined level, a bit line selection circuit 3120 for selecting a bit line, a clamping circuit 3140 for clamping a bit line, and a current source 3150 for providing a current to a bit line. In FIG. 14, the memory cell 3110 is an MRAM cell including an MTJ, which is an example.

The data read circuit 3100 may include a first sense amplification circuit 3160 for performing sensing/amplifying operations based on an integrating operation by using a plurality of reference voltages according to an exemplary embodiment of the inventive concept and a second sense amplification circuit 3170 for performing common sensing/amplifying operations. The data read circuit 3100 may further include a first control circuit 3161 for controlling selection of the first sense amplification circuit 3160 in response to a first control signal Ctrl11 and a second control circuit 3171 for controlling selection of the second sense amplification circuit 3170 in response to a second control signal Ctrl12, so that the data read circuit 3100 selectively operates the first sense amplification circuit 3160 and the second sense amplification circuit 3170.

The first control circuit 3161 and the second control circuit 3171 may be implemented with MOS transistors which receive the first control signal Ctrl11 and the second control signal Ctrl12 through gate electrodes, respectively. First and second electrodes of the first control circuit 3161 are connected to an input terminal of the first sense amplification circuit 3160 (for example, a first input terminal which receives the data voltage VSA) and an output terminal of the first sense amplification circuit 3160, respectively. First and second electrodes of the second control circuit 3171 are connected to an input terminal of the second sense amplification circuit 3170 (for example, a first input terminal which receives an output VOUT1 of the first control circuit 3161) and an output terminal of the second sense amplification circuit 3170, respectively. The first sense amplification circuit 3160 receives the first and second reference voltages VREFH and VREFL through second and third input terminals, respectively. The first and second reference voltages VREFH and VREFL may be DC voltages generated in the non-volatile memory device 1100 by using a voltage provided from the outside, or DC voltages directly provided from the outside, as mentioned previously. The first and second reference voltages VREFH and VREFL may be voltages developed by reference cells which store logic-high information or logic-low information.

The second sense amplification circuit 3170 receives a reference voltage VREF through a second input terminal. The reference voltage VREF may be a DC voltage generated in the non-volatile memory device 1100 or directly provided from the outside. The reference voltage VREF may have a level approximately corresponding to an intermediate value between the first reference voltage VREFH and the second reference voltage VREFL.

As shown in FIG. 14, the data read circuit 3100 includes the first sense amplification circuit 3160 based on an integration circuit using dual reference voltages VREFH and VREFL as well as the second sense amplification circuit 3170 which performs an amplifying operation using the single reference voltage VREF. In a test mode of the non-volatile memory device 1100, the first control signal Ctrl11 and the second control signal Ctrl12 may be provided to the first sense amplification circuit 3160 and the second sense amplification circuit 3170, such that characteristics of output waveforms produced by using the first sense amplification circuit 3160 and the second sense amplification circuit 3170 may be determined. When the second sense amplification circuit 3170 is selected, the data voltage VSA from the bit line BL passes through the first control circuit 3161 and is provided to the first input terminal of the second sense amplification circuit 3170. The second sense amplification circuit 3170 compares the data voltage VSA with the reference voltage VREF and outputs an amplification signal VOUT2 corresponding to this comparison result.

On the other hand, if the first sense amplification circuit 3160 is selected, the data voltage VSA is provided to the first input terminal of the first sense amplification circuit 3160 and as mentioned in the foregoing embodiments, an integrating operation is performed according to a voltage level difference between the data voltage VSA and the first and second reference voltages VREFH and VREFL, and a differential output signal corresponding to an integration result is generated. Thereafter, at a predetermined point in time, the differential output signal is sensed/amplified, such that an amplification signal VOUT1 is output from the first sense amplification circuit 3160. The output terminal of the first sense amplification circuit 3160 may be electrically connected to the output terminal of the second sense amplification circuit 3170 through the second control circuit 3171.

In the test mode, a waveform of a data signal may be analyzed using the amplification signals VOUT1 and VOUT2 output from the first and second sense amplification circuits 3160 and 3170. By referring to a result of this analysis, one of the first sense amplification circuit 3160 and the second sense amplification circuit 3170 may be set to be used in a normal operation of the non-volatile memory device 1100. For example, if the amplification signal VOUT2 output from the second sense amplification circuit 3170 requires more time to reach a full digital level, the first sense amplification circuit 3160 is set to be enabled in the normal operation of the non-volatile memory device 1100. The non-volatile memory device 1100 may include a mode register set (MRS) storing MRS code for setting an operation mode, such that the first control circuit 3161 and the second control circuit 3171 may be controlled by an MRS code in an initial driving of the non-volatile memory device 1100.

Figure 15:
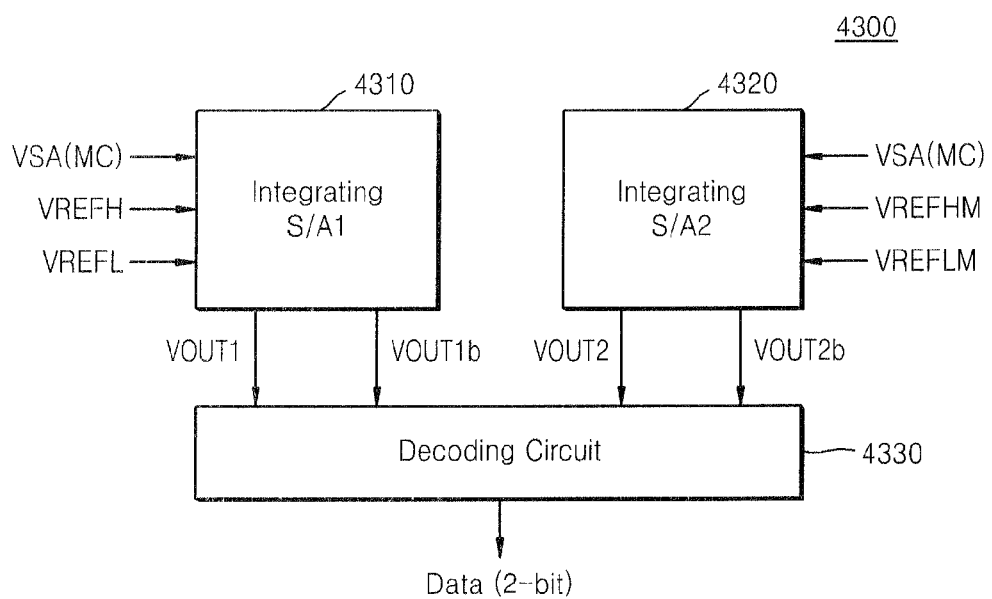
FIG. 15 is a block diagram of a data read circuit that may be included in a non-volatile memory device according to an exemplary embodiment of the inventive concept.

FIG. 15 is a block diagram of a data read circuit that may be included in a non-volatile memory device according to an exemplary embodiment of the inventive concept. For convenience' sake, of the above-described components, only a sense amplification circuit is shown in the data read circuit.

A data read circuit 4300 for reading data from a unit cell which stores data of 2 bits or more is shown in FIG. 15. For example, the non-volatile memory device 1100 may store 2-bit data per memory cell (or per unit cell). By using a multi-level cell (MC), a unit cell for storing single 2-bit data may be implemented, or by using two single-level cells, a unit cell for storing 2-bit data may be implemented.

When 2-bit data is stored in a unit cell, the data voltage VSA delivered through a bit line connected to the unit cell has one of four level states. A plurality of reference voltages are used to read data stored in such a unit cell, and for example, four reference voltages VREFH, VREFL, VREFHM, and VREFLM may be used. Similarly to the foregoing embodiments, these reference voltages VREFH, VREFL, VREFHM, and VREFLM may be generated from reference cells which store the four data states, respectively. The reference voltages VREFH, VREFL, VREFHM, and VREFLM may be generated in the non-volatile memory device 1100 by using a voltage provided from the outside or may be DC voltages directly provided from the outside.

The data read circuit 4300 may include a first sense amplification circuit 4310 and a second sense amplification circuit 4320 which correspond to a bit line. The first sense amplification circuit 4310 and the second sense amplification circuit 4320 receive a data voltage VSA and at least two reference voltages, respectively. For example, when 2-bit data is stored in a unit cell, four reference voltages may be generated, the first sense amplification circuit 4310 may receive the first and fourth reference voltages VREFH and VREFL, and the second sense amplification circuit 4320 may receive the second and third reference voltages VREFHM and VREFLM.

Each of the first and second sense amplification circuits 4310 and 4320 differentially amplifies input voltages and performs sensing/amplifying operations with respect to differential output signals, as described in the foregoing embodiments. The first sense amplification circuit 4310 integrates a voltage level difference between the data voltage VSA and the first and fourth reference voltages VREFH and VREFL to generate differential output signals, and senses/amplifies the differential output signals at a predetermined point in time, thus generating amplified differential output signals VOUT1 and VOUT1b. Likewise, the second sense amplification circuit 4320 integrates a voltage level difference between the data voltage VSA and the second and third reference voltages VREFHM and VREFLM to generate differential output signals, and senses/amplifies the differential output signals at a predetermined point in time, thus generating amplified differential output signals VOUT2 and VOUT2b. The data read circuit 4300 may further include a decoding circuit 4330 for receiving the amplified differential output signals VOUT1, VOUT1b, VOUT2, and VOUT2b.

The decoding circuit 4330 decodes the amplified differential output signals VOUT1, VOUT1b, VOUT2, and VOUT2b to generate a data signal Data. The level of the data voltage VSA has a different value according to data stored in a unit cell, and the amplified differential output signals VOUT1, VOUT1b, VOUT2, and VOUT2b based on the integrating and sensing/amplifying operations using the data voltage VSA may also have different levels. The decoding circuit 4330 analyzes the amplified differential output signals VOUT1, VOUT1b, VOUT2, and VOUT2b to generate the 2-bit data signal Data.

While an exemplary embodiment for reading 2-bit data for each unit cell and an exemplary embodiment with the two sense amplification circuits 4310 and 4320 per unit cell are shown in FIG. 15, the inventive concept is not limited thereto. For example, to improve the accuracy of the decoding operation, three or more sense amplification circuits may be disposed for a unit cell. In this case, by properly combining the four reference voltages VREFH, VREFL, VREFHM, VREFLM, different dual reference voltages may be provided for different sense amplification circuits. For example, in the case where four sense amplification circuits are used, the data read circuit may include the two sense amplification circuits that respectively receive the first and fourth reference voltages VREFH and VREFL and the second and third reference voltages VREHM and VREFLM, as shown in FIG. 15. The other two sense amplification circuits may be the same as those shown in FIG. 15, except that the first and third reference voltages VREFH and VREFLM are provided to one of these sense amplification circuits and the second and fourth reference voltages VREFHM and VREFL are provided to the other of these sense amplification circuits.

Data of 3 bits or more may be stored in each unit cell, and in this case, a larger number of reference voltages may be generated from reference cells or reference voltage generation units.

Figure 16A:
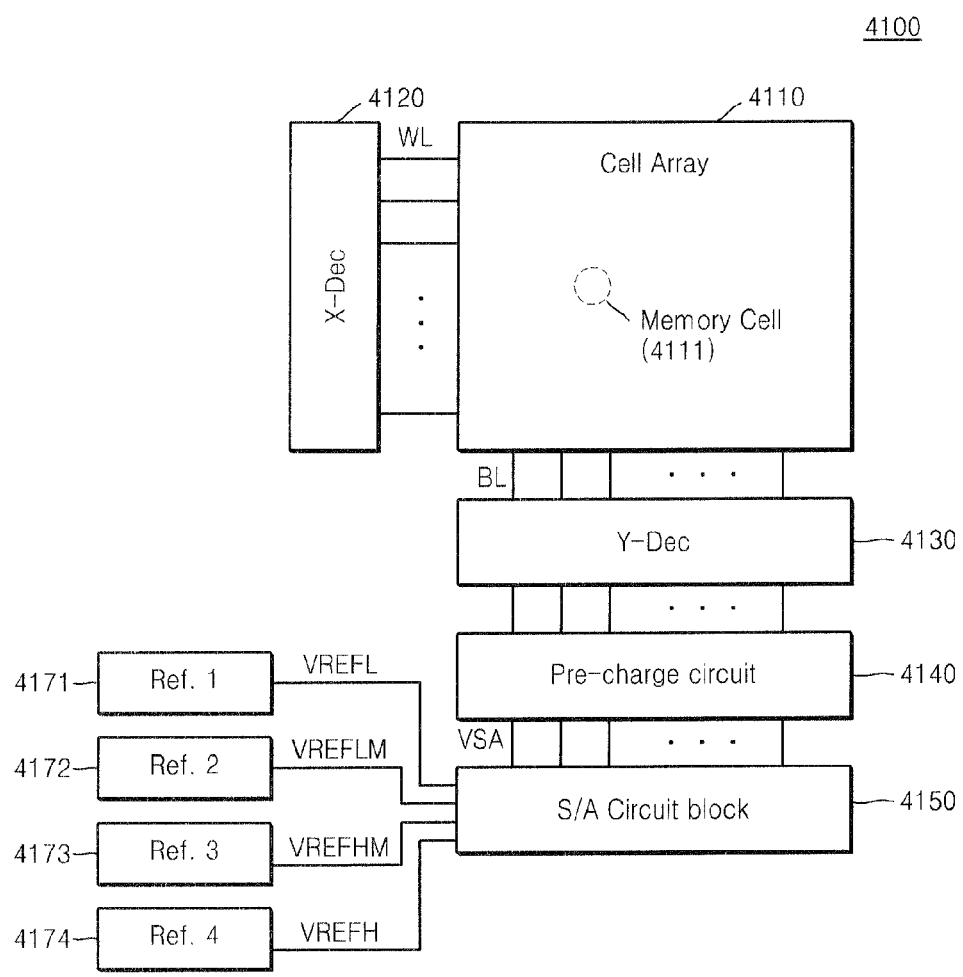
FIGS. 16A and 16B are block diagrams of non-volatile memory devices that may include the data read circuit of FIG. 15, according to exemplary embodiments of the inventive concept.
Figure 16B:
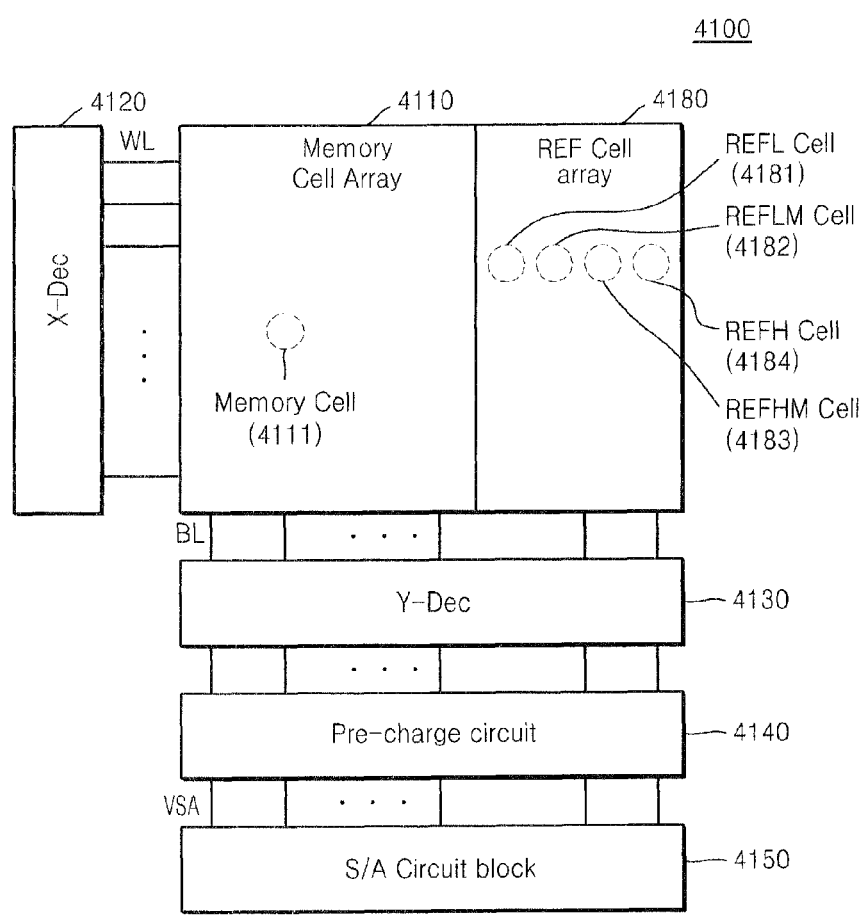

FIGS. 16A and 16B are block diagrams of non-volatile memory devices that may include the data read circuit 4300 of FIG. 15, according to exemplary embodiments of the inventive concept. In describing the current embodiments, the same or similar components as those of the above-described embodiments may perform substantially the same operations, and thus a detailed description thereof is omitted.

Referring to FIG. 16A, a non-volatile memory device 4100 may include a memory cell array 4110 including a plurality of memory cells 4111 (for example, MRAM cells) as a non-volatile cell array, a row decoder 4120 for selecting a word line WL of the memory cell array 4110, a column decoder 4130 for selecting a bit line BL of the memory cell array 4110, a pre-charge circuit unit 4140 for performing a pre-charging operation, and a sense amplification circuit block 4150 for sensing/amplifying data.

In addition, the non-volatile memory device 4100 may include first to fourth reference voltage generation units 4171, 4172, 4173, and 4174 for generating various reference voltages VREFL, VREFLM, VREFHM, and VREFH for data sensing. For example, the first reference voltage generation unit 4171 generates a low-level reference voltage VREFL, the second reference voltage generation unit 4172 generates a low-intermediate level reference voltage VREFLM, the third reference voltage generation unit 4173 generates a high-intermediate level reference voltage VREFHM, and the fourth reference voltage generation unit 4174 generates a high-level reference voltage VREFH. In FIG. 16A, the first to fourth reference voltage generation units 4171 to 4174 are illustrated as blocks having different functions, but a single functional block may generate a plurality of reference voltages.

Further, according to the exemplary embodiments of the inventive concept, the plurality of reference voltages VREFL, VREFLM, VREFHM, and VREFH, e.g., the first to fourth reference voltages VREFL, VREFLM, VREFHM, and VREFH, are provided to the sense amplification circuit block 4150. In FIG. 16A, the first to fourth reference voltages VREFL, VREFLM, VREFHM, and VREFH are generated by the first to fourth reference voltage generation units 4171 to 4174, respectively, included in the non-volatile memory device 4100, but the first to fourth reference voltages VREFL, VREFLM, VREFHM, and VREFH may be generated by an external controller (not shown) and provided to the non-volatile memory device 4100. The sense amplification circuit block 4150 receives a data voltage VSA and the first to fourth reference voltages VREFL, VREFLM, VREFHM, and VREFH. For example, each sense amplification circuit in the sense amplification circuit block 4150 receives the data voltage VSA, receives at least one of the first to fourth reference voltages VREFL, VREFLM, VREFHM, and VREFH, and performs sensing and amplifying operations by using the received signals. The number of reference voltages and components related to the reference voltages may be modified in various ways to obtain these objectives.

FIG. 16B illustrates an example of generating a reference voltage in a different way from that of FIG. 16A. For example, a non-volatile memory device 4100 illustrated in FIG. 16B generates reference voltages (for example, the first to fourth reference voltages VREFL, VREFLM, VREFHM, and VREFH) for reading data from a reference cell. For this, the non-volatile cell array of the non-volatile memory device 4100 further includes a reference cell array 4180 in addition to the memory cell array 4110. The reference cell array 4180 may include reference cells having resistances corresponding to a plurality of data states. For example, when data is sensed using four reference voltages, the reference cell array 4180 includes first to fourth reference cells 4181 to 4184 providing the first to fourth reference voltages VREFL, VREFLM, VREFHM, and VREFH. The memory cell 4111 of the cell array 4110 storing data and the first to fourth reference cells 4181 to 4184 of the reference cell array 4180 may have the same cell structure.

Any one of data '00', '01', '10', and '11' may be stored in the first to fourth reference cells 4181 to 4184 of the reference cell array 4180. A writing operation with respect to the first to fourth reference cells 4181 to 4184 may be performed once. Data '00' is written in the first reference cell 4181, data '01' is written in the second reference cell 4182, data '10' is written in the third reference cell 4183, and data '11' is written in the fourth reference cell 4184. In the reference cell array 4180, the first to fourth reference cells 4181 to 4184 may be disposed to correspond to at least some of the word lines WL, or alternatively, the first to fourth reference cells 4181 to 4184 may be disposed to correspond to each of the word lines WL. Accordingly, during a reading operation with respect to the memory cell array 4110, information written in the first to fourth reference cells 4181 to 4184 of the reference cell array 4180 is also read.

Figure 16C:
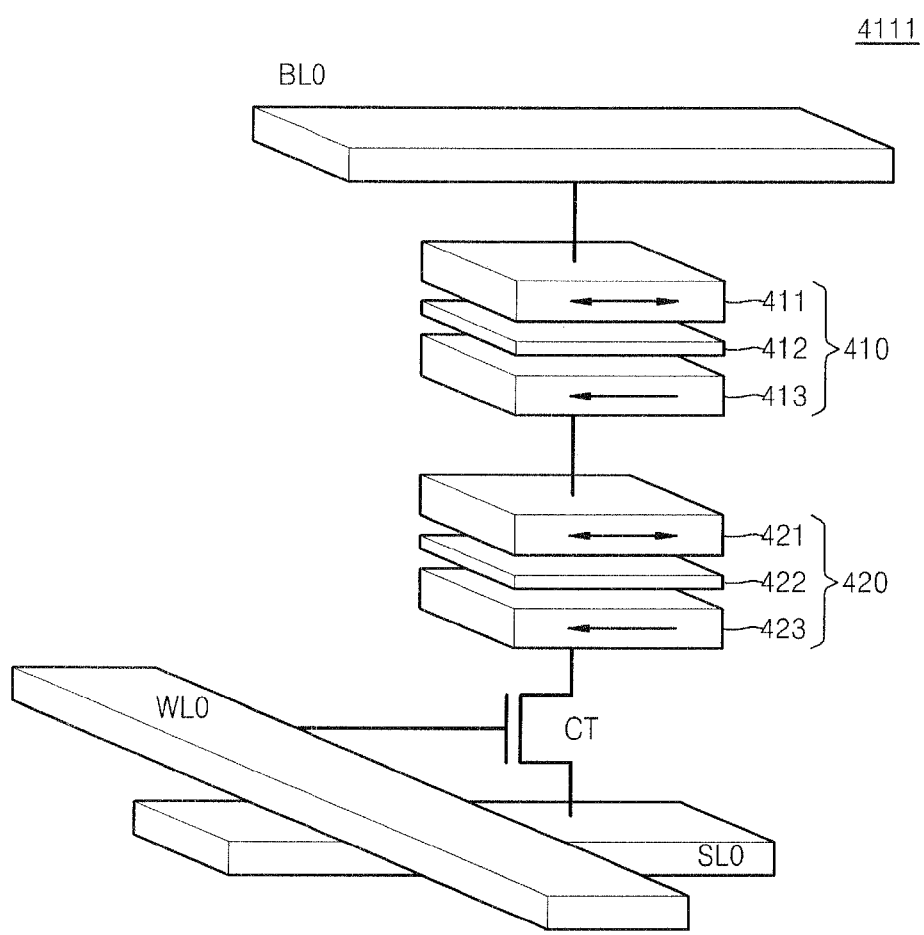
FIG. 16C is a perspective view of a non-volatile memory cell illustrated in FIGS. 16A and 16B according to an exemplary embodiment of the inventive concept.

FIG. 16C is a perspective view of a non-volatile memory cell illustrated in FIGS. 16A and 16B according to an exemplary embodiment of the inventive concept. In FIG. 16C, a STT-MRAM serves as an example of the non-volatile memory cell. A non-volatile memory device may store data of at least two bits per unit cell by using a multi-level cell (MLC). The unit cell may be configured by allowing one MTJ cell to have any one resistance from among four resistances or by allowing two MTJ cells to each have any one resistance from among two resistances. FIG. 16C illustrates an example where two MTJ cells are disposed in a unit cell.

Referring to FIG. 16C, the memory cell 4111 may include a first MTJ cell 410, a second MTJ cell 420, and a cell transistor CT. A gate of the cell transistor CT is connected to a word line (for example, a first word line BL0), and an electrode of the cell transistor CT is connected to a bit line (for example, a first bit line BL0) via a plurality of MTJ cells, namely, the first and second MTJ cells 410 and 420. In addition, the other electrode of the cell transistor CT is connected to a source line SL0.

The first MTJ cell 410 includes a first fixed layer 413, a first free layer 411, and a first tunnel layer 412 interposed between the first fixed layer 413 and the first free layer 411. The second MTJ cell 420 includes a second fixed layer 423, a second free layer 421, and a second tunnel layer 422 interposed between the second fixed layer 423 and the second free layer 421. Magnetization directions of the first and second fixed layers 413 and 423 are fixed, and magnetization directions of the first and second free layers 411 and 421 may be the same as or opposite to the magnetization directions of the first and second fixed layers 413 and 423 under different conditions. An element for fixing the magnetization directions of the first and second fixed layers 413 and 423, for example, an anti-ferromagnetic layer, may be further provided.

Figure 17:
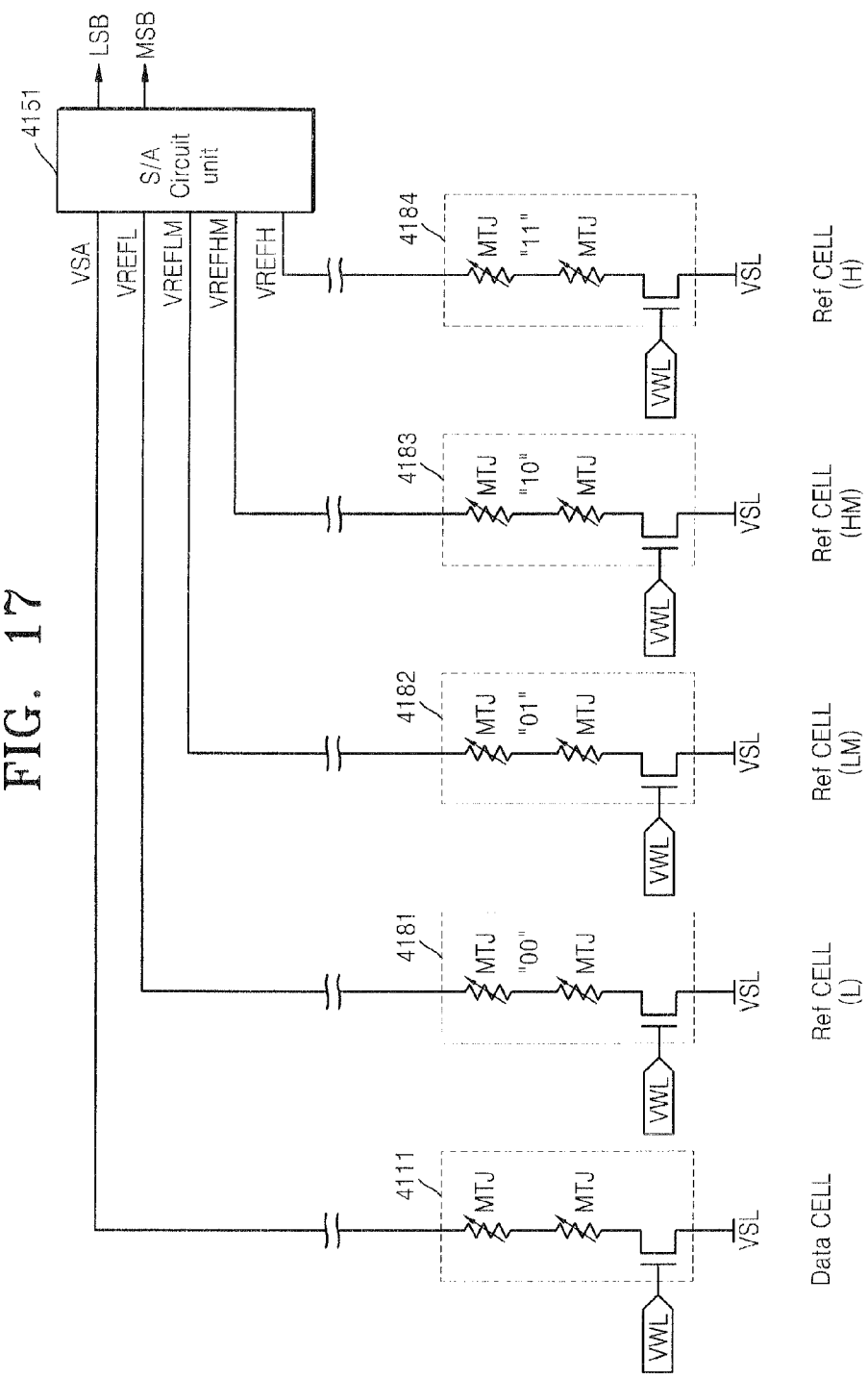
FIG. 17 is a circuit diagram for illustrating a data reading operation of non-volatile memory device according to an exemplary embodiment of the inventive concept.

FIG. 17 is a circuit diagram for illustrating a data reading operation of the non-volatile memory device 4100, according to an exemplary embodiment of the inventive concept. For convenience of description, illustration of various circuits included in a data pass circuit (e.g., memory cell 4111) or a reference pass circuit (e.g., first to fourth reference cells 4181-4184) will be omitted.

Referring to FIGS. 16A and 16B, the data voltage VSA and the first to fourth reference voltages VREFL, VREFLM, VREFHM, and VREFH generated by the data pass circuit and the reference pass circuit are provided to the sense amplification circuit block 4150. The sense amplification circuit block 4150 includes a plurality of sense amplification circuit units. For example, each sense amplification circuit unit 4151 may be disposed to correspond to any one data pass circuit. Although not shown in FIG. 17, the other sense amplification circuit units may be disposed to correspond to respective data pass circuits, and the first to fourth reference voltages VREFL, VREFLM, VREFHM, and VREFH may be commonly provided to the plurality of sense amplification circuit units.

The sense amplification circuit unit 4151 senses and amplifies the data voltage VSA and may be included in the sense amplification circuit block 4150 of FIGS. 16A and 16B. Output of the sense amplification circuit unit 4151 may be latched by a predetermined latch circuit (not shown) and may be provided as read data to the outside.

According to the current embodiment, the sense amplification circuit unit 4151 may perform sensing and amplifying operations by using the data voltage VSA and the first to fourth reference voltages VREFL, VREFLM, VREFHM, and VREFH. The first to fourth reference voltages VREFL, VREFLM, VREFHM, and VREFH may have voltages developed according to data values stored in the first to fourth reference cells 4181 to 4184. As the data voltage VSA is developed, a difference in voltage level arises between the data voltage VSA and the first to fourth reference voltages VREFL, VREFLM, VREFHM, and VREFH. For example, when data '00' is written in the memory cell 4111, the data voltage VSA and the first reference voltage VREFL have the same voltage level, and a difference in level arises between the data voltage VSA and the second to fourth reference voltages VREFLM, VREFHM, and VREFH.

The sense amplification circuit unit 4151 compares a level of the data voltage VSA and levels of the first to fourth reference voltages VREFL, VREFLM, VREFHM, and VREFH and amplifies differences in voltage level therebetween to generate output signals, and performs decoding operations with respect to the output signals to generate multi-bit least significant bit (LSB) data and most significant bit (MSB) data. An operation for generating the output signal may include an operation for generating a differential signal corresponding to the differences in a level between the data voltage VSA and the first to fourth reference voltages VREFL, VREFLM, VREFHM, and VREFH and operations for sensing and amplifying the generated differential signal. In addition, the operation for generating the differential signal may be performed by an integrated circuit using a capacitor (not shown), and an operation for accumulating the differences in voltage level between the data voltage VSA and the first to fourth reference voltages VREFL, VREFLM, VREFHM, and VREFH in the capacitor may be performed.

In addition, the sense amplification circuit unit 4151 may include a plurality of sense amplification circuits (not shown) to correspond to one data pass circuit, and also may include a decoder (not shown) for generating the multi-bit LSB data and MSB data by combining output signals of the sense amplification circuits. The first to fourth reference voltages VREFL, VREFLM, VREFHM, and VREFH may be classified as at least two reference voltage combinations each including at least one reference voltage, and the reference voltage combinations are provided to the respective sense amplification circuits. Each of the sense amplification circuits receives a combination of the data voltage VSA and one reference voltage and generates an output signal generated due to a difference in level of the received signals.

Figure 18A:
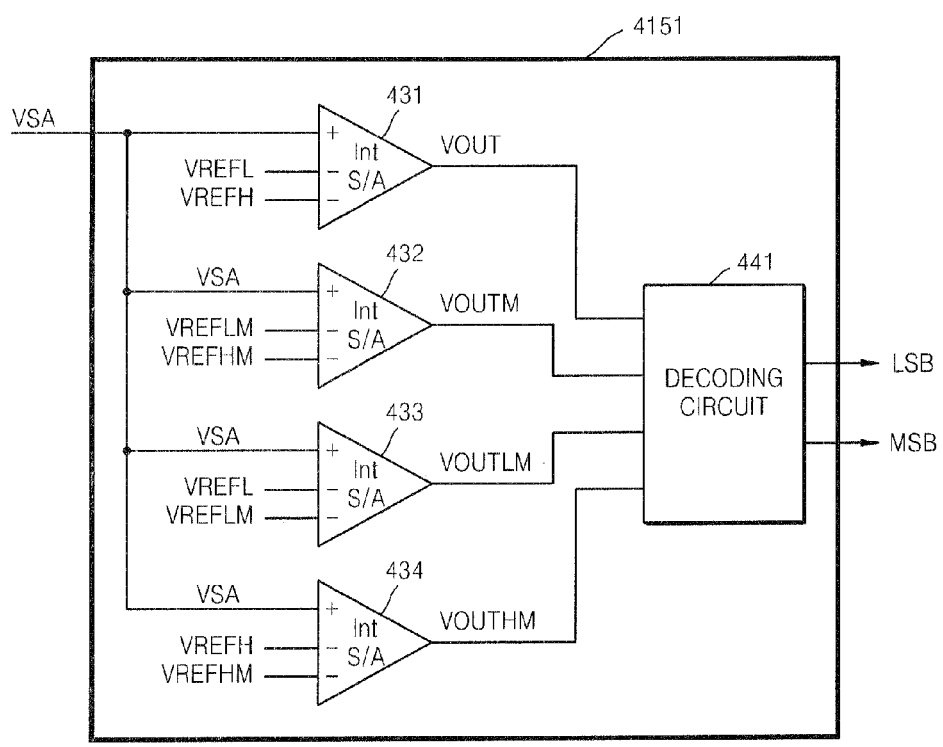
FIG. 18A is a block diagram illustrating a sense amplification circuit unit shown in FIG. 17 according to an exemplary embodiment of the inventive concept.

FIG. 18A is a block diagram illustrating the sense amplification circuit unit 4151, according to an exemplary embodiment of the inventive concept. FIG. 18B is a table for explaining the outputting of multi-bit LSB data and MSB data, according to an exemplary embodiment of the inventive concept.

Referring to FIG. 18A, the sense amplification circuit unit 4151 includes a plurality of sense amplification circuits to correspond to one data voltage VSA or the memory cell 4111. For example, the sense amplification circuit unit 4151 may include first to fourth sense amplification circuits 431 to 434 and a decoding circuit 441. Each of the first to fourth sense amplification circuits 431 to 434 commonly receives the data voltage VSA due to data stored in the memory cell 4111, and also receives any one reference voltage combination from among a plurality of reference voltage combinations. For example, the first to fourth reference voltages VREFL, VREFLM, VREFHM, and VREFH may be classified as four reference voltage combinations, and the reference voltage combinations are provided to the respective first to fourth sense amplification circuits 431 to 434. The first to fourth sense amplification circuits 431 to 434 generate output signals by performing sensing and amplifying operations using voltages input thereto. For example, the first sense amplification circuit 431 generates a first output signal VOUT by performing sensing and amplifying operations using the data voltage VSA and the first and fourth reference voltages VREFL and VREFH.

By using the above-described method, the second sense amplification circuit 432 receives the data voltage VSA and the second and third reference voltages VREFLM and VREFHM and generates a second output signal VOUTM. In addition, the third sense amplification circuit 433 receives the data voltage VSA and the first and second reference voltages VREFL and VREFLM and generates a third output signal VOUTLM. In addition, the fourth sense amplification circuit 434 receives the data voltage VSA and the third and fourth reference voltages VREFHM and VREFH and generates a fourth output signal VOUTHM.

The first to fourth output signals VOUT, VOUTM, VOUTLM, and VOUTHM generated by the first to fourth sense amplification circuits 431 to 434, respectively, are provided to the decoding circuit 441. The decoding circuit 441 decodes the received output signals to output the multi-bit MSB data and LSB data of the MLC.

FIG. 18A illustrates an example of a circuit for reading the MLC storing data of 2 bits per unit cell, but the present inventive concept is not limited thereto. For example, a different number of sense amplification circuits may be disposed to correspond to one unit cell, and combinations of the first to fourth reference voltages VREFL, VREFLM, VREFHM, and VREFH provided to the respective sense amplification circuits may be defined in various ways. In addition, the MLC may store data of more than 3 bits per unit cell. In this case, a greater number of reference voltages may be generated from the reference cells or may be provided from the outside. In addition, in FIG. 18A, the decoding circuit 441 is included in the sense amplification circuit unit 4151, but the decoding circuit 441 may be included in a separate decoder circuit block (not shown) disposed outside of the sense amplification circuit unit 4151.

Further, referring to FIG. 18B, the data voltage VSA is developed in different ways according to a data value stored in the MLC, and the output signals, which are output from the first to fourth sense amplification circuits 431 to 434 of the sense amplification circuit unit 4151, vary.

For example, when data '00' is stored in the MLC, the data voltage VSA generated by the MLC is the same as the first reference voltage VREFL. Accordingly, the first sense amplification circuit 431 senses and amplifies a difference in level between the data voltage VSA and the fourth reference voltage VREFH to output the first output signal VOUT having a logic low-level L. The second sense amplification circuit 432 senses and amplifies a difference in level between the data voltage VSA and the second and third reference voltages VREFLM and VREFEIM to output the second output signal VOUTM having a logic low-level L. The third sense amplification circuit 433 senses and amplifies a difference in level between the data voltage VSA and the second reference voltage VREFLM to output the third output signal VOUTLM having a logic low-level L. The fourth sense amplification circuit 434 senses and amplifies a difference in level between the data voltage VSA and the third and fourth reference voltages VREFLM and VREFH to output the fourth output signal VOUTHM having a logic low-level L.

In addition, when data '01' is stored in the MLC, the data voltage VSA generated by the MLC is the same as the second reference voltage VREFLM. Accordingly, a difference in level arises between the data voltage VSA and the first, third, and fourth reference voltages VREFL, VREFHM, and VREFH, and the difference in level is sensed and amplified by the sense amplification circuits. In this case, the first sense amplification circuit 431 outputs the first output signal VOUT having a logic low-level L, the second sense amplification circuit 432 outputs the second output signal VOUTM having a logic low-level L, the third sense amplification circuit 433 outputs the third output signal VOUTLM having a logic high-level H, and the fourth sense amplification circuit 434 outputs the fourth output signal VOUTHM having a logic low-level L.

In addition, when data '10' is stored in the MLC, the data voltage VSA generated by the MLC is the same as the third reference voltage VREFHM. In this case, the first to third sense amplification circuits 431 to 433 output the first to third output signals VOUT, VOUTM, and VOUTLM having a logic high-level H, respectively. Further, the fourth sense amplification circuit 434 outputs the fourth output signal VOUTHM having a logic low-level L. In addition, when data '11' is stored in the MLC, the data voltage VSA generated by the MLC is the same as the fourth reference voltage VREFH. In this case, the first to fourth sense amplification circuits 431 to 434 output the first to fourth output signals VOUT, VOUTM, VOUTLM, and VOUTHM having a logic high-level H, respectively.

FIGS. 19A and 19B are circuit diagrams illustrating the decoding circuit 441 of FIG. 18A, according to exemplary embodiments of the inventive concept. As illustrated in FIG. 19A, a decoding circuit 441A may include a first XOR gate 451 and a second XOR gate 452 for performing XOR operations. Referring to FIGS. 18A and 19A, the decoding circuit 441A receives and decodes a first output signal VOUT, a second output signal VOUTM, a third output signal VOUTLM, and a fourth output signal VOUTHM to output multi-bit data stored in the MLC. For example, when data of 2 bits is stored in the MLC, the decoding circuit 441A outputs multi-bit MSB data and LSB data.

Referring to the table illustrated in FIG. 18B, first MSB data has a value corresponding to a level of the first output signal VOUT. In other words, if the first output signal VOUT has a logic low-level L, the first MSB data stored in the MLC has a logic-low value '0', and if the first output signal VOUT has a logic-high level H, the first MSB data has a logic-high value '1'.

Further, second LSB data has a value varying according to levels of other output signals. For example, the value of the second LSB data may be determined by the second to fourth output signals VOUTM, VOUTLM, and VOUTHM undergoing a logic operation. For example, an XOR operation may be used to determine the value of the second LSB data. For this, the decoding circuit 441A may include the first and second XOR gates 451 and 452. The first XOR gate 451 receives the third and fourth output signals VOUTLM and VOUTHM and outputs a result of the XOR of the third and fourth output signals VOUTLM and VOUTHM. The second XOR gate 452 receives a signal output from the first XOR gate 451 and the second output signal VOUTM and outputs a result of the XOR of the signal received from the first XOR gate 451 and the second output signal VOUTM as the second LSB data. Here, the second LSB data may be the result of the XOR of the third output signal VOUTLM and the fourth output signal VOUTHM.

Referring to FIGS. 18B and 19A, if the XOR of the third output signal VOUTLM and the fourth output signal VOUTHM has a logic-low value '0', the second LSB data has a value corresponding to a level of the first output signal VOUT, and if the XOR of the third output signal VOUTLM and the fourth output signal VOUTHM has a logic-high value '1', the second LSB data has a value corresponding to an opposite level of the first output signal VOUT.

The configuration of an output decoder 441A described with reference to FIGS. 19A is just an example, and the number and configurations of the above-described logic gates may vary to obtain the same objectives, and also may be partially modified according to timing characteristics of a semiconductor memory device.

Further, FIG. 19B is a circuit diagram illustrating the decoding circuit 441 of FIG. 18A according to an exemplary embodiment of the inventive concept. A decoding circuit 441B of FIG. 19B receives and decodes a first output signal VOUT, a third output signal VOUTLM, and a fourth output signal VOUTHM to output multi-bit data stored in the MLC. A first XOR gate 453 receives the third output signal VOUTLM and the fourth output signal VOUTHM and outputs a result of the XOR of the third output signal VOUTLM and the fourth output signal VOUTHM. In addition, in the table illustrated in FIG. 18B, since the first output signal VOUT is the same as a second output signal VOUTM, the first output signal VOUT instead of the second output signal VOUTM may be provided to a second XOR gate 454. The second XOR gate 454 receives a signal output from the first XOR gate 453 and the first output signal VOUT and outputs a result of the XOR of the signal output from the first XOR gate 453 and the first output signal VOUT as second LSB data. Here, the second LSB data may be the result of the XOR of the third output signal VOUTLM and the fourth output signal VOUTHM.

FIG. 20 is a block diagram illustrating a non-volatile memory device that may include the data read circuit 4300 of FIG. 15, according to an exemplary embodiment of the inventive concept. In FIG. 20, it is assumed that a decoding circuit is configured as a block separate from a sense amplification circuit block. For convenience of description, FIG. 20 illustrates only the sense amplification circuit block and a decoder block.

A non-volatile memory device 4100A includes a sense amplification circuit block 4110A and a decoder block 4120A to read data of a cell array (not shown). The sense amplification circuit block 4110A includes a plurality of sense amplification circuit units 4111A, 4112A, 4113A, . . . , and the sense amplification circuit units 4111A, 4112A, 4113A, . . . may be disposed to correspond to data read circuits. For example, n sense amplification circuit units may be disposed to correspond to n data read circuits, and each sense amplification circuit unit may include a plurality of sense amplification circuits.

As illustrated in FIG. 20, the decoder block 4120A may be disposed outside of the sense amplification circuit block 4110A and may include a plurality of decoding circuits 4121A, 4122A, 4123A, . . . corresponding to the sense amplification circuit units 4111A, 4112A, 4113A, . . . . In addition, each decoding circuit may include a plurality of bit generating units to generate multi-bit data. For example, as illustrated in FIG. 20, when the MLC stores data of 2 bits, each of the decoding circuits 4121A, 4122A, 4123A, . . . may include LSB and MSB generating units. The LSB and MSB generating units may exchange an operation result and/or an intermediate operation result.

As described above, a plurality of reference voltages VREF are used to read the MLC, and the reference voltages VREF are commonly provided to the sense amplification circuit units 4111A, 4112A, 4113A, . . . . In addition, the reference voltages VREF may be classified as a plurality of reference voltage combinations. For example, when each of the sense amplification circuit units 4111 A, 4112A, 4113A, . . . includes four sense amplification circuits, the reference voltages VREF may be classified as four reference voltage combinations Ref_comb1 to Ref combo.

The sense amplification circuit units 4111A, 4112A, 4113A, . . . perform sensing and amplifying operations by using the data voltage VSA and the reference voltage combinations Ref comb1 to Ref comb4 and generate the first to fourth output signals VOUT, VOUTM, VOUTLM, and VOUTHM. In addition, the LSB and MSB generating units decode the first to fourth output signals VOUT, VOUTM, VOUTLM, and VOUTHM and each output LSB data and MSB data.

The reference voltages VREF may be combined in various ways. For example, the reference voltages VREF may be combined in a way different from the table illustrated in FIG. 18B. In this case, levels of the first to fourth output signals VOUT, VOUTM, VOUTLM, and VOUTHM that are output from the sense amplification circuit units 4111A, 4112A, 4113A, . . . may have different values.

The decoding circuits 4121A, 4122A, 4123A, . . . may be designed in consideration of level characteristics of the first to fourth output signals VOUT, VOUTM, VOUTLM, and VOUTHM. In other words, a method of determining multi-bit data may vary according to the level characteristics of the first to fourth output signals VOUT, VOUTM, VOUTLM, and VOUTHM, and the LSB and MSB generating units may be designed in a different way from those of FIGS. 19A and 19B according to the method of determining multi-bit data.

Figure 21:
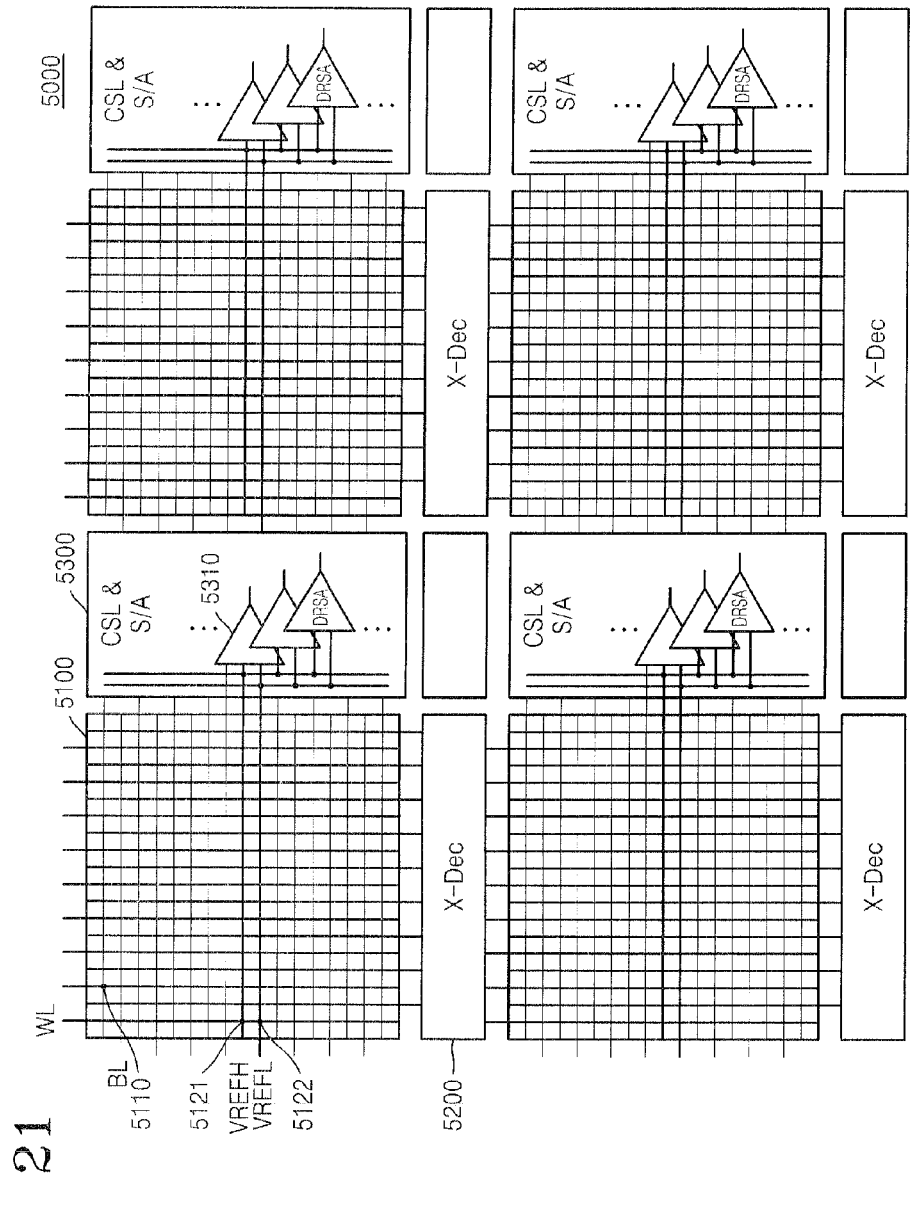
FIGS. 21 and 22 are block diagrams of non-volatile memory devices having different layouts according to exemplary embodiments of the inventive concept.
Figure 22:
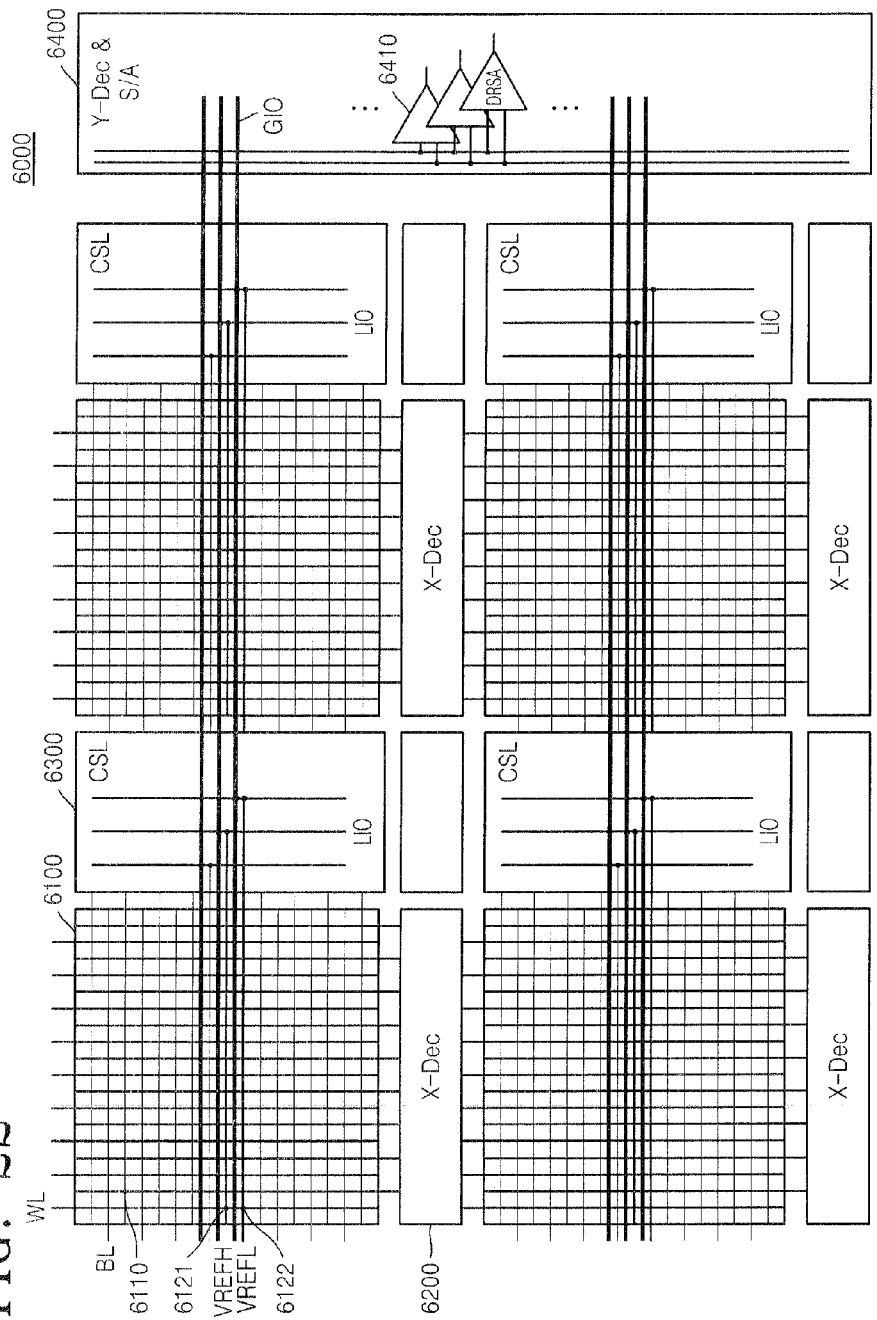

FIGS. 21 and 22 are block diagrams of non-volatile memory devices having different layouts according to exemplary embodiments of the inventive concept. Shown in FIG. 21 is an example where a sense amplification circuit block is disposed for each cell array, and shown in FIG. 22 is an example where a plurality of cell arrays share a sense amplification circuit block.

As shown in FIG. 21, a non-volatile memory device 5000 may include a cell array 5100 including a plurality of memory cells 5110, a row decoder 5200 for selecting a word line WL of the cell array 5100, and a column selection region 5300 for selecting a bit line BL of the cell array 5100. The column selection region 5300 may include a sense amplification circuit block (e.g., a plurality of sense amplification circuits 5310 of a data read circuit according to an exemplary embodiment of the inventive concept) and column select lines CSL, and the column selection region 5300 controls connection between a bit line BL and a sense amplification circuit 5310 in response to a column selection signal from a column decoder.

The cell array 5100 may include a plurality of reference cells for generating reference voltages VREFH and VREFL, and for example, a first reference cell 5121 for generating a first reference voltage VREFH and a second reference cell 5122 for generating a second reference voltage VREFL. The plurality of memory cells 5110 and the first and second reference cells 5121 and 5122 may be connected for a single word line WL, and data voltages from the plurality of memory cells 5110 are provided to an input terminal of the sense amplification circuit 5130 through respective bit lines BL.

The voltages developed on the bit lines BL connected to the first and second reference cells 5121 and 5122 are provided as the first reference voltage VREFH and the second reference voltage VREFL to the column selection region 5300. The plurality of sense amplification circuits 5310 may be disposed in the column selection region 5300, and the first and second reference voltages VREFH and VREFL may be commonly provided to the plurality of sense amplification circuits 5310. In other words, the first and second reference voltages VREFH and VREFL generated from the first and second reference cells 5121 and 5122 are locally provided to the sense amplification circuit 5310, and read data generated from the sense amplification circuit 5310 are delivered to an input/output circuit through a global line.

FIG. 22 is a block diagram of an example of a non-volatile memory device having a different layout than the non-volatile memory device 5000 shown in FIG. 21. As shown in FIG. 22, a non-volatile memory device 6000 may include a cell array 6100 including a plurality of memory cells 6110, a row decoder 6200 for selecting a word line WL of the cell array 6100, and a column selection region 6300 for selecting a bit line BL of the cell array 6100 using a column select line CSL. The cell array 6100 may include a first reference cell 6121 for generating the first reference voltage VREFH and a second reference cell 6122 for generating the second reference voltage VREFL.

The non-volatile memory device 6000 may further include a column decoder region 6400 which generates a column selection signal by decoding a column address. The column decoder region 6400 may be disposed at a side to correspond to a plurality of cell arrays 6100, and a column selection signal from the column decoder region 6400 may be globally delivered and commonly provided to at least two cell arrays 6100. On the column decoder region 6400, a sense amplification circuit block (e.g., a plurality of sense amplification circuits 6410 of a data read circuit according to an exemplary embodiment of the inventive concept) may be disposed.

A local delivery line LIO for locally delivering the first and second reference voltages VREFH and VREFL may be disposed in the column selection region 6300, and the first and second reference voltages VREFH and VREFL from the first and second reference cells 6121 and 6122 are provided to the column decoder region 6400 through the local delivery line LIO and a global delivery line GIO. The first and second reference voltages VREFH and VREFL delivered through the global delivery line GIO may be commonly provided to the plurality of sense amplification circuits 6410.

According to the structure of the non-volatile memory device 6000 shown in FIG. 22, the sense amplification circuits 6410 are shared between a plurality of cell arrays 6100, thus reducing an area taken up by the sense amplification circuits 6410. On the other hand, since a data voltage and reference voltages are delivered through the global delivery line GIO before reaching a full digital level, a variation in voltage level according to resistance components of the global delivery line GIO may occur, but the data read circuit according to the foregoing embodiments may reduce an influence of the variation, thus improving the reliability of read data.

Figure 23:
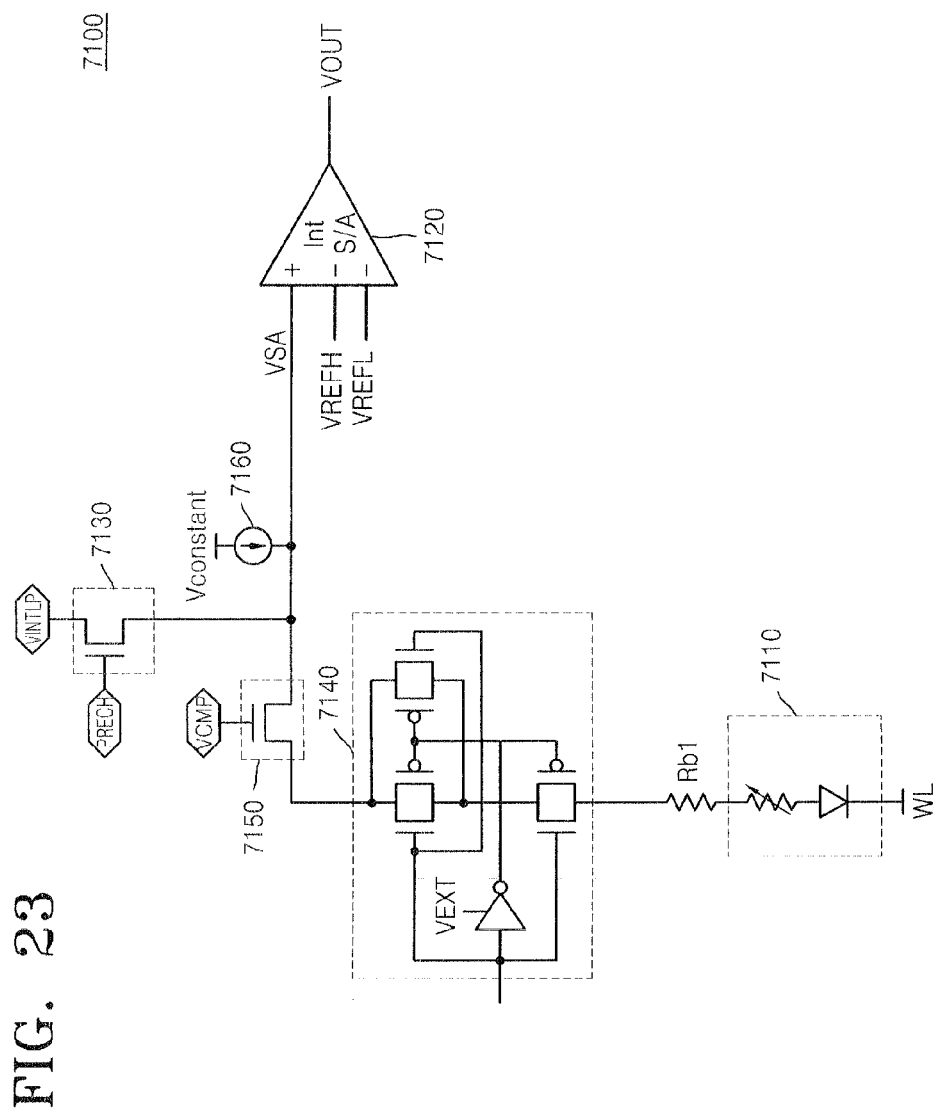
FIG. 23 is a circuit diagram of a data read circuit that may be included in a non-volatile memory device according to an exemplary embodiment of the inventive concept.

FIG. 23 is a circuit diagram of a data read circuit that may be included in a non-volatile memory device according to an exemplary embodiment of the inventive concept. In FIG. 23, a different memory than an MRAM described in the foregoing embodiments is applied.

As shown in FIG. 23, a data read circuit 7100 includes various circuits for reading data stored in a memory cell 7110, such as a sense amplification circuit 7120 for receiving and sensing/amplifying a data voltage VSA and at least two reference voltages VREFH and VREFL. The data read circuit 7100 may further include a pre-charging circuit 7130 for pre-charging a bit line to a predetermined level, a bit line selection circuit 7140 for selecting a bit line, a clamping circuit 7150 for clamping a bit line, and a current source 7160 for providing a current to a bit line.

The memory cell 7110 may include a resistive memory, such as a Programmable Random Access Memory (PRAM) cell or an RRAM cell, as a non-volatile memory cell. As shown in FIG. 23, each of the PRAM cell and the RRAM cell may be configured or modeled with a diode and a resistive element which are serially connected. Data is stored according to variable-resistance characteristics of the resistive element, a node of the resistive element is connected to a bit line, and a node of a diode (e.g., a cathode electrode) is connected to a word line WL. Although not shown in FIG. 23, the resistive element may be substituted by a ferroelectric capacitor which uses a ferroelectric thin film when the non-volatile memory cell is implemented with an FRAM cell.

As in the foregoing embodiments, the reference voltages VREFH and VREFL may be generated from reference cells having the same structure as the memory cell 7110. For example, by performing a data write operation with respect to the reference cells once, resistive elements of some reference cells may have a high resistance value and resistive elements of some other reference cells may have a low resistance value. In a subsequent data read operation, a reference cell is selected to develop a voltage of a bit line connected to the reference cell to one of the reference voltages VREFH and VREFL. The sense amplification circuit 7120 receives the data voltage VSA and the reference voltages VREFH and VREFL, generates a differential output signal by performing an integrating operation according to a voltage level difference between the data voltage VSA and the reference voltages VREFH and VREFL, and senses/amplifies the differential output signal at a predetermined point in time, thus generating an amplified output signal VOUT.

Figure 24:
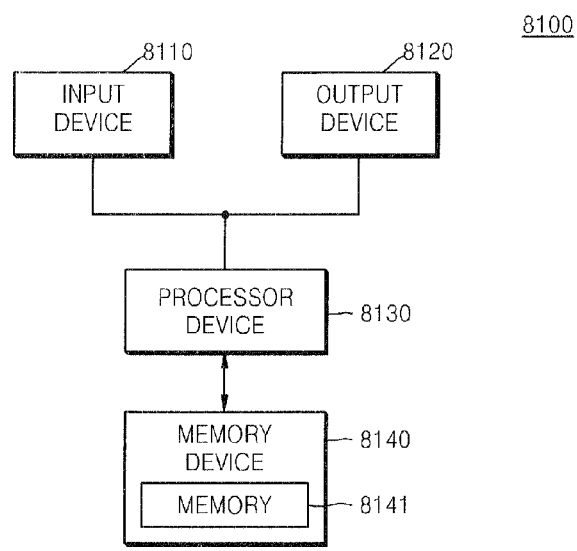
FIG. 24 is a block diagram of an electronic system including a non-volatile memory device according to an exemplary embodiment of the inventive concept.

FIG. 24 is a block diagram of an electronic system including a non-volatile memory device according to an exemplary embodiment of the inventive concept. Referring to FIG. 24, an electronic system 8100 may include an input device 8110, an output device 8120, a memory device 8140, and a processor device 8130. The memory device 8140 may include a cell array including a plurality of non-volatile memory cells and a peripheral circuit for performing operations such as read/write, or may include a non-volatile memory device and a memory controller as a system. For example, assume that the memory device 8140 includes a memory controller and a non-volatile memory device; then a memory 8141 shown in FIG. 24 may employ a non-volatile memory device according to an exemplary embodiment of the inventive concept. The processor device 8130 may be connected to the input device 8110, the output device 8120, and the memory device 8140 through corresponding interfaces, thus controlling the overall operation of the electronic system 8100.

Figure 25:
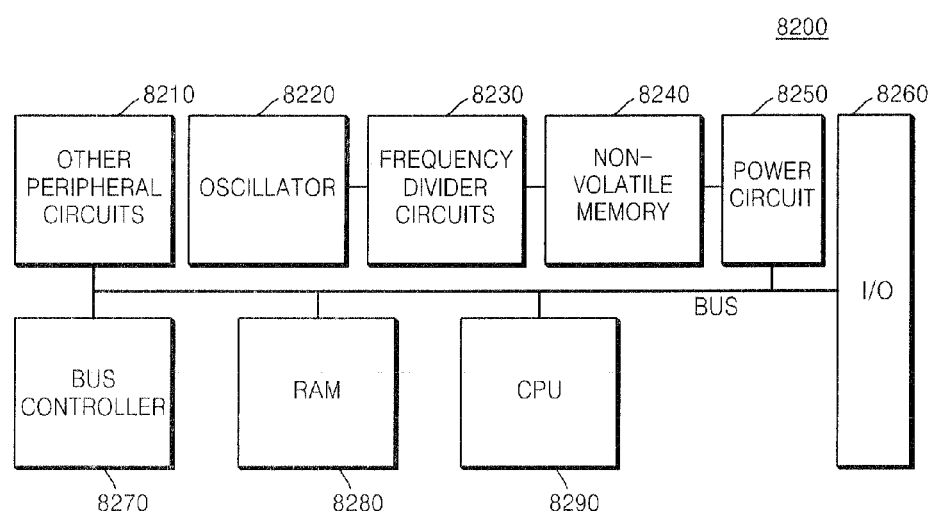
FIG. 25 is a block diagram of a single-chip microcomputer including a non-volatile memory device according to an exemplary embodiment of the inventive concept.

FIG. 25 is a block diagram of a single-chip microcomputer including a non-volatile memory device according to an exemplary embodiment of the inventive concept. Referring to FIG. 25, a microcomputer 8200 in the form of a circuit module may include a Central Processing Unit (CPU) 8290, a memory used as a work area of the CPU 8290, for example, a RAM 8280, a bus controller 8270, an oscillator 8220, frequency divider circuits 8230, a non-volatile memory 8240, a power circuit 8250, an input/output port 8260, and other peripheral circuits 8210 including a timer counter and so forth which are electrically connected to an internal bus BUS.

The CPU 8290 may include a command control part and an execution part, decodes a fetched command through the command control part, and performs a processing operation according to a result of the decoding through the execution part. The non-volatile memory 8240 stores an operation program or data of the CPU 8290 and various types of data. The power circuit 8250 generates a voltage necessary for read/write operations with respect to the non-volatile memory 8240. The frequency divider circuits 8230 divide a source frequency provided from the oscillator 8220 into a plurality of frequencies to provide reference clock signals and other internal clock signals.

The internal bus BUS may include an address bus, a data bus, and a control bus. The bus controller 8270 controls access to the BUS in response to an access request from the CPU 8290. If the microcomputer 8200 is mounted on a system, the CPU 8290 controls read/write operations with respect to the non-volatile memory 8240. In a device test or at a manufacturing stage, an external recording device may directly control read/write operations with respect to the non-volatile memory 8240 through the input/output port 8260.

At least one of the non-volatile memory 8240 or the RAM 8280 may use a non-volatile memory device according to an exemplary embodiment of the inventive concept. In other words, the non-volatile memory device according to an exemplary embodiment of the inventive concept may be used to store large-volume data, and the non-volatile memory device according to an exemplary embodiment of the inventive concept may also be used in place of the RAM 8280 which requires rapid read/write operations.

Figure 26:
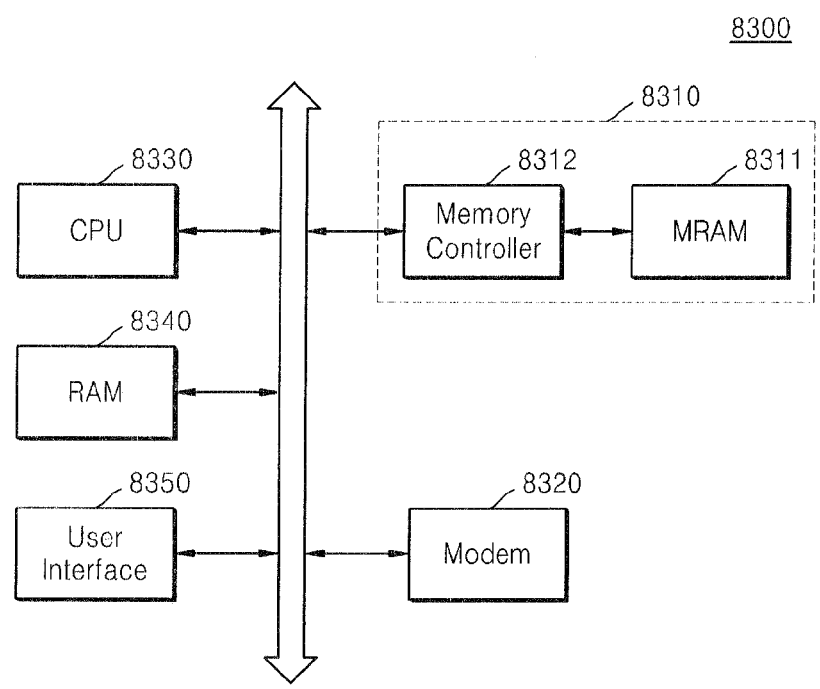
FIG. 26 is a block diagram of an information processing system having a non-volatile memory device/system according to an exemplary embodiment of the inventive concept.

FIG. 26 is a block diagram of an information processing system having a non-volatile memory device/system according to an exemplary embodiment of the inventive concept.

Referring to FIG. 26, a non-volatile memory system 8310 according to an exemplary embodiment of the inventive concept may be included in a mobile device or a computer system such as a desktop computer. A computer system 8300 (e.g., an information processing system) may include the non-volatile memory system 8310, a modem 8320, a CPU 8330, a RAM 8340, and a User Interface (UI) 8350 which are electrically connected to a system bus. The non-volatile memory system 8310 may include a memory controller 8312 and a non-volatile memory device 8311. In FIG. 26, for example, an MRAM is used as the non-volatile memory device 8311. However, the non-volatile memory device 8311 may include a flash memory or a non-volatile memory such as PRAM, an RRAM, an FRAM, or the like.

Data processed by the CPU 8330 or data input from the outside is stored in the non-volatile memory system 8310. At least one of the non-volatile memory system 8310 and the RAM 8340 may include a non-volatile memory device according to an exemplary embodiment of the inventive concept. In other words, the non-volatile memory device according to an exemplary embodiment of the inventive concept may be applied to a memory for storing large-volume data required for the computer system 8300 or a memory which stores data requiring rapid access thereto such as system data. An application chipset, a Camera Image Processor (CIS), an input/output device, etc. may be further provided in the computer system 8300.

While the inventive concept has been particularly shown and described with reference to exemplary embodiments thereof, it will be understood by those of ordinary skill in the art that various changes in form and detail may be made therein without departing from the spirit and scope of the inventive concept as defined by the following claims.

What is claimed is:

1. A method of reading data from a non-volatile memory device, comprising:
   receiving, at a first sense amplifier, a data voltage, a first reference voltage and a second reference voltage, wherein the data voltage corresponds to data stored in a memory cell;
   sensing, at the first sense amplifier, a voltage level difference between the data voltage and the first and second reference voltages to generate first and second differential output signals; and
   amplifying, at a second sense amplifier, the first and second differential output signals to generate read data for the memory cell.

2. The method of claim 1, wherein the second sense amplifier amplifies the first and second differential output signals after a first delay.

3. The method of claim 2, wherein the first delay is a time from when the first sense amplifier is enabled to when the second sense amplifier is enabled.

4. The method of claim 1, further comprising;
   pre-charging first and second differential output terminals of the first sense amplifier to first level voltages in response to a control signal, prior to receiving the data voltage and the first and second reference voltages.

5. The method of claim 4, wherein the sensing performed at the first sense amplifier comprises:
   storing two voltage levels applied to the first and second differential output terminals, wherein the two voltage levels are based on the voltage level difference between the data voltage and the first and second reference voltages.

6. The method of claim 5, wherein the sensing performed at the first sense amplifier comprises:
   providing, from the first sense amplifier, the two voltage levels as the first and second differential output signals to the second sense amplifier in response to a version of the control signal delayed by the first delay,
   wherein the amplification performed at the second sense amplifier comprises:
   amplifying the first and second differential output signals; and
   outputting the amplified first and second differential output signals as the read data.

7. A non-volatile memory device, comprising:
   a cell array including a plurality of memory cells; and
   a sense amplification circuit configured to receive a data voltage of a memory cell, a first reference voltage and a second reference voltage during a data read operation of the memory cell, generate differential output signals based on a voltage level difference between the data voltage and the first and second reference voltages, and output the differential output signals as data read from the memory cell.

8. The nonvolatile memory device of claim 7, wherein the sense amplification circuit comprises:
   a first sense amplifier, in response to a control. signal, the first sense amplifier is configured to receive the data voltage and the first and second reference voltages and generate the differential output signals based on the voltage level difference between the data voltage and the first and second reference voltages;
   a delay unit configured to receive the control signal and generate a delayed control signal; and
   a second sense amplifier, in response to the delayed control signal, the second sense amplifier is configured to amplify the differential output signals and output the amplified differential output signals as the data read from the memory cell.

9. The non-volatile memory device of claim 7, further comprising:
   a first reference voltage generation unit configured to generate the first reference voltage; and
   a second reference voltage generation unit configured to generate the second reference voltage,
   wherein the first and second reference voltage generation units are separate from the cell array.

10. The non-volatile memory device of claim 7, further comprising a reference cell array, the reference cell array comprising:
    a first reference cell configured to generate the first reference voltage; and
    a second reference cell configured to generate the second reference voltage.

11. The non-volatile memory device of claim 10, wherein the first and second reference cells have the same structure as the memory cell.

12. The non-volatile memory device of claim 7, wherein the data voltage has a high voltage level or a low voltage level.

13. The non-volatile memory device of claim 12, wherein the first reference voltage has the same voltage level as the data voltage and the second reference voltage has a different voltage level than the data voltage.

14. The non-volatile memory device of claim 12, wherein the second reference voltage has the same voltage level as the data voltage and the first reference voltage has a different voltage level than the data voltage.

15. The non-volatile memory device of claim 7, wherein the memory cell is a magnetic random access memory (MRAM), phase change random access memory (PRAM), resistive random access memory (RRAM), or ferroelectric random access memory (FRAM).

16. A non-volatile memory device, comprising:
    a cell array including a memory cell, a first reference cell and a second reference cell, wherein the memory cell is connected to a first bit line, the first reference cell is connected to a second bit line and the second reference cell is connected to a third bit line; and
    a sense amplifier configured to receive a data voltage of the memory cell provided from the first bit line, a first reference voltage of the first reference cell provided from the second bit line and a second reference voltage of the second reference cell provided from the third bit line and, in response to the receipt of the data voltage and the first and second reference voltages, the sense amplifier is configured to determine a difference between the data voltage and the first and second reference voltages and output this difference as data read from the memory cell.

17. The non-volatile memory device of claim 1.6, wherein the difference between the data voltage and the first and second reference voltages is determined after a time delay measured from when a first part of the sense amplifier is enabled by a control signal to when a delayed version of the control signal enables a second part of the sense amplifier.

18. The non-volatile memory device of claim 16, wherein the data voltage is generated by a data voltage generating unit including the memory cell, the first reference voltage is generated by a first reference voltage generating unit including the first reference cell and the second reference voltage is generated by a second reference voltage generating unit including the second reference cell, wherein the data voltage generating unit, the first reference voltage generating unit and the second reference voltage generating unit each have the same structure.

19. A spin torque transfer (STT) magnetic random access memory (MRAM) device, comprising:
a sense amplifier having a first node that receives a data voltage provided from a memory cell, a second node that receives a first reference voltage, a third node that receives a second reference voltage, and a fourth node that outputs a signal as data read from the memory cell, wherein the signal is based on a voltage level difference between the data voltage and the first and second reference voltages.

20. The STT MRAM device of claim 19, wherein the first reference voltage is provided from a first reference voltage generation unit and the second reference voltage is provided from a second reference voltage generation unit.

* * * * *